US012648226B2

(12) United States Patent
Cheng et al.

(10) Patent No.: US 12,648,226 B2
(45) Date of Patent: Jun. 2, 2026

(54) TRAPPING LAYER FOR A RADIO FREQUENCY DIE AND METHODS OF FORMATION

(71) Applicant: Taiwan Semiconductor Manufacturing Company, Ltd., Hsinchu (TW)

(72) Inventors: Yu-Hung Cheng, Tainan (TW); Ching I Li, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 558 days.

(21) Appl. No.: 17/869,135

(22) Filed: Jul. 20, 2022

(65) Prior Publication Data

US 2024/0030222 A1      Jan. 25, 2024

(51) Int. Cl.
H10D 87/00      (2026.01)
H01L 21/762      (2006.01)
H01L 23/66      (2006.01)

(52) U.S. Cl.
CPC ....... H10D 87/00 (2025.01); H01L 21/76254 (2013.01); H01L 23/66 (2013.01); *H01L 2223/6616* (2013.01)

(58) Field of Classification Search
CPC ........... H01L 27/1207; H01L 21/76254; H01L 23/66; H01L 2223/6616; H01L 24/05; H01L 24/80; H01L 25/18; H01L 25/0652; H01L 24/08; H01L 2225/06541; H01L 25/0657; H01L 25/50
See application file for complete search history.

(56) References Cited

U.S. PATENT DOCUMENTS

| | | | |
|---|---|---|---|
| 2003/0119280 A1* | 6/2003 | Lee .................... | H01L 21/76254 438/479 |
| 2007/0023066 A1* | 2/2007 | Yokokawa ........ | H01L 21/02052 257/E21.228 |
| 2014/0084290 A1* | 3/2014 | Allibert ............. | H01L 21/02052 438/479 |
| 2014/0319698 A1* | 10/2014 | Molin ............... | H01L 21/76256 257/774 |
| 2016/0043044 A1* | 2/2016 | Stuber .................. | H01L 23/552 438/107 |
| 2017/0040210 A1* | 2/2017 | Wakabayashi .... | H01L 21/02381 |

(Continued)

*Primary Examiner* — William B Partridge
*Assistant Examiner* — Ilker Ozden
(74) *Attorney, Agent, or Firm* — Harrity & Harrity, LLP

(57) ABSTRACT

An insulator layer of a trap-rich silicon-on-insulator (SOI) wafer is formed on a trapping layer over a high-temperature substrate instead of forming the insulator layer on a bulk silicon substrate. The silicon layer of the trap-rich SOI wafer is formed on a second wafer and is bonded to the insulator layer that was grown on the trapping layer. The second wafer is then removed by grinding, polishing, and/or another technique such that no cutting of the silicon device layer is performed, and therefore little to no surface damage is caused to the silicon layer. Accordingly, a high-temperature annealing operation to remove surface damage that would otherwise be caused by cutting of the silicon layer may be omitted. Thus, operations to form the trap-rich SOI wafer may be performed at lower temperatures, which enables the trapping layer of the trap-rich SOI wafer to be formed to a lesser thickness.

20 Claims, 24 Drawing Sheets

(56)　　　　　　References Cited

U.S. PATENT DOCUMENTS

| | | | | |
|---|---|---|---|---|
| 2017/0062452 A1* | 3/2017 | Syu | ........................ | H10B 43/50 |
| 2018/0061786 A1* | 3/2018 | Lin | ......................... | H01L 23/66 |
| 2018/0069079 A1* | 3/2018 | Fanelli | ................. | H10D 84/038 |
| 2018/0114720 A1* | 4/2018 | Wang | ............... | H01L 21/02381 |
| 2018/0308928 A1* | 10/2018 | Cheng | ................ | H01L 21/0262 |
| 2018/0337043 A1* | 11/2018 | Englekirk | ......... | H01L 21/02658 |
| 2018/0350785 A1* | 12/2018 | Fong | ....................... | H01L 24/94 |
| 2019/0035767 A1* | 1/2019 | Yu | ........................... | H01L 21/56 |
| 2019/0058031 A1* | 2/2019 | Figuet | .............. | H01L 21/02447 |
| 2020/0161336 A1* | 5/2020 | Lamy | ................... | H01L 21/324 |
| 2020/0303329 A1* | 9/2020 | Elsherbini | .............. | H01L 24/16 |
| 2021/0376070 A1* | 12/2021 | Lu | .................... | H01L 21/02002 |
| 2022/0123118 A1* | 4/2022 | Yang | ...................... | H10D 30/69 |
| 2022/0148908 A1* | 5/2022 | Augendre | ......... | H01L 21/02002 |

* cited by examiner

300

204

212b

300

204

216

T1

212b

400

204

216

404

212b

1600

| Form a trapping layer over a first substrate | 1610 |

| Form an insulator layer over the trapping layer | 1620 |

| Form a silicon layer over a second substrate | 1630 |

| Bond the insulator layer and the silicon layer | 1640 |

| Remove the second substrate after bonding the insulator layer and the silicon layer | 1650 |

TRAPPING LAYER FOR A RADIO FREQUENCY DIE AND METHODS OF FORMATION

BACKGROUND

Integrated circuits are formed on semiconductor substrates and are packaged to form so-called chips, chiplets, or microchips, among other examples. Some integrated circuits are formed on bulk semiconductor substrates comprising semiconductor material, such as silicon. However, semiconductor-on-insulator (SOI) substrates may be used as an alternative to bulk semiconductor substrates. SOI substrates have a thin layer of active semiconductor (e.g., silicon) separated from an underlying handle substrate by a layer of insulating material. The layer of insulating material electrically isolates the thin layer of active semiconductor from the handle substrate, thereby reducing current leakage of devices formed within the thin layer of active semiconductor. The thin layer of active semiconductor may also provide faster switching times and lower operating voltages, which have made SOI substrates widely used for high volume fabrication of radio frequency (RF) systems, such as RF switches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
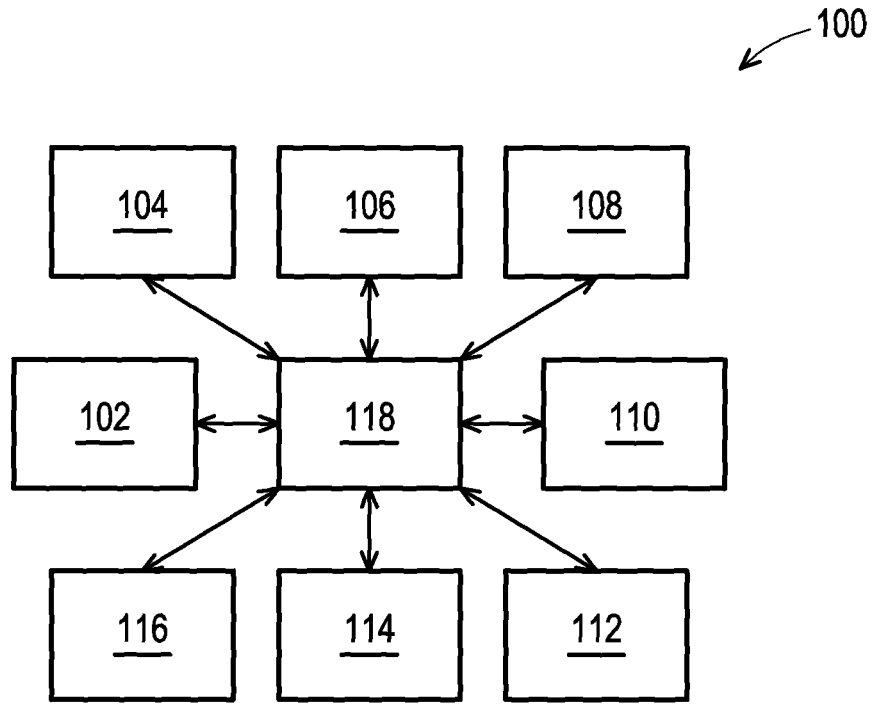
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Radio frequency (RF) devices, which are typically manufactured on semiconductor-on-insulator (SOI) substrates, operate at high frequencies and generate RF signals. The SOI substrates typically include a high-resistance substrate (sometimes referred to as a handle substrate), an insulator layer over the handle substrate, and a semiconductor layer disposed over the insulator layer. The high resistance of the high-resistance substrate may improve RF performance of an RF device in the high-resistance substrate, may resist carrier migration, thereby reducing cross-talk, parasitic capacitance, and/or harmonic distortion in the RF device. However, some cross-talk, parasitic capacitance, and/or harmonic distortion may still occur due to carrier migration into the high-resistance substrate, which may result in reduced signal to interference plus noise (SINR) at high frequencies and decreased RF device performance.

In some cases, an RF device may be formed on trap-rich SOI wafers to further reduce carrier migration, which may reduce cross-talk, parasitic capacitance, and/or harmonic distortion for the RF devices. A trap-rich SOI wafer includes a trapping layer between a high-resistance substrate and an insulator layer. The trapping layer may be referred to as "trap-rich" in that the trapping layer includes one or more materials that easily trap free charge carriers, which reduces carrier migration by preventing the free charge carriers from migrating into the high-resistance substrate. This may further reduce cross-talk, parasitic capacitance, and/or harmonic distortion. RF devices such as RF switches operate at high frequencies.

A trapping layer in a trap-rich SOI wafer may be formed to a thickness to provide sufficient protection and accommodation of temperatures that are used in processing of the trap-rich SOI wafer. In general, a thicker trapping layer may provide better thermal protection relative to a thinner trapping layer. For example, a trapping layer may be formed to a thickness that is included in a range of approximately 1.7 microns to approximately 1.8 microns to withstand high processing temperatures up to approximately 1050 degrees Celsius or greater.

High processing temperatures may be used during annealing of the trap-rich SOI wafer to remove surface damage that is caused during processing. In some cases, the insulator layer may be formed on a bulk silicon substrate. The insulator layer and the bulk silicon substrate are then bonded to a trapping layer that is grown on a high-resistance substrate. Most of the bulk silicon substrate is then cut off, leaving behind the insulator layer and a silicon layer on the trapping layer over the high-resistance substrate. The cutting results in surface damage to the silicon layer, for which a high-temperature annealing operation may be performed as a surface treatment to remove the surface damage caused by the cutting. Accordingly, the trapping layer needs to be formed to a sufficient thickness to withstand this high-temperature annealing operation.

The grain size of the material in the trapping layer may be a function of the thickness of the trapping layer. For example, the grain size of the material in the trapping layer may be directly proportional to the thickness of the trap-rich poly layer. Thus, the grain size of the material in the trapping layer may increase as the thickness of the trapping layer increases. A large grain size in the trap-rich poly layer may result in reduced resistance in the trapping layer and may provide fewer electron/hole trapping centers that are used to recombine the coupling of charges between the insulator layer and the trapping layer, which may result in reduced charge trapping performance in the trapping layer. Thus, a large grain size (in a range of approximately 300 nanometers to approximately 500 nanometers, for example) may reduce and/or negate the cross-talk reduction, the parasitic capacitance reduction, and/or the harmonic distortion reductions provided by the trapping layer.

Some implementations described herein provide trap-rich SOI wafer formation techniques and RF devices that may be formed on a trap-rich SOI wafer that is formed using the trap-rich SOI wafer formation techniques described herein. As described herein, an insulator layer of a trap-rich SOI wafer is formed on a trapping layer over a high-temperature substrate instead of forming the insulator layer on a bulk silicon substrate. The silicon layer of the trap-rich SOI wafer is formed on a second wafer and is bonded to the insulator layer that was grown on the trapping layer. The second wafer is then removed by grinding, polishing, and/or another technique such that no cutting of the silicon device layer is needed, and therefore little to no surface damage is caused to the silicon layer.

Accordingly, high-temperature processing, such as a high-temperature annealing operation to remove surface damage that would otherwise be caused by cutting of the silicon layer, may be omitted in the process to form the trap-rich SOI wafer. Thus, operations to form the trap-rich SOI wafer may be performed at a lower thermal budget (e.g., at lower temperatures), which enables the trapping layer of the trap-rich SOI wafer to be formed to a lesser thickness than if high-temperature processing were to be performed for the trap-rich SOI wafer. The lesser thickness of the trapping layer may provide a smaller grain size for the material in the trapping layer. The smaller grain size may enable the trapping layer to provide reduced cross-talk, reduced parasitic capacitance, and/or reduced harmonic distortion, which may increase the SINR performance, may reduce insertion loss, and/or may improve other RF performance parameter(s) of RF devices for in the silicon layer of the trap-rich SOI wafer.

Moreover, as described herein, an RF die (which may be formed on the trap-rich SOI wafer described herein) and a logic die may be vertically stacked or vertically arranged to form a three-dimensional RF device die. Wafer on wafer (WoW) bonding may be performed to bond the RF die on the logic die, or vice-versa, as opposed to forming the logic die and the RF die horizontally adjacent on the same wafer. Vertically stacking the logic die and the RF die reduces the horizontal footprint of the RF device die, which enables a greater quantity of RF dies to be formed on the same wafer and a greater quantity of logic dies to be formed on the same wafer. Moreover, forming RF dies and logic dies on separate wafers that are to be bonded may reduce the complexity of masks that are used to form the RF dies and logic dies, and may reduce the complexity of testing the RF dies and logic dies. In addition, forming RF dies and logic dies on separate wafers that are to be bonded may increase yield of RF device dies in that the yield of RF dies is not affected by the yield of logic dies, or vice-versa, as might be the case when RF dies and logic dies are formed on the same wafer.

In some cases, the temperatures that are used in forming logic dies may be relatively high (e.g., relative to the temperatures that are used in forming RF dies). Accordingly, forming RF dies and logic dies on separate wafers that are to be bonded may enable the RF dies to be formed without consideration of the temperatures that are used in forming the logic dies. This may reduce the likelihood of damage to the layers and/or structures of the RF dies, and/or may enable the layers and/or structures of the RF dies to be formed to smaller sizes which may enable increased device density and increased performance in the RF dies.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, a bonding tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The bonding tool 116 is a semiconductor processing tool that is capable of bonding two or more wafers (or two or more semiconductor substrates, or two or more semiconductor devices) together. For example, the bonding tool 116 may include a eutectic bonding tool that is capable of forming a eutectic bond between two or more wafers together. For example, the bonding tool may heat the two or more wafers to form a eutectic system between the materials of the two or more wafers. As another example, the bonding tool 116 may include a hybrid bonding tool, a direct bonding tool, and/or another type of bonding tool.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may form a trapping layer over a first substrate. The method includes forming an insulator layer over the trapping layer; may form a silicon layer over a second substrate; may bond the insulator layer and the silicon layer; and/or may remove the second substrate after bonding the insulator layer and the silicon layer.

As another example, the one or more of the semiconductor processing tools 102-116 may form a logic die; may form an RF die; and/or may bond the logic die and the RF die to form an RF device die, where the logic die and the RF die are vertically stacked in the RF device die.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
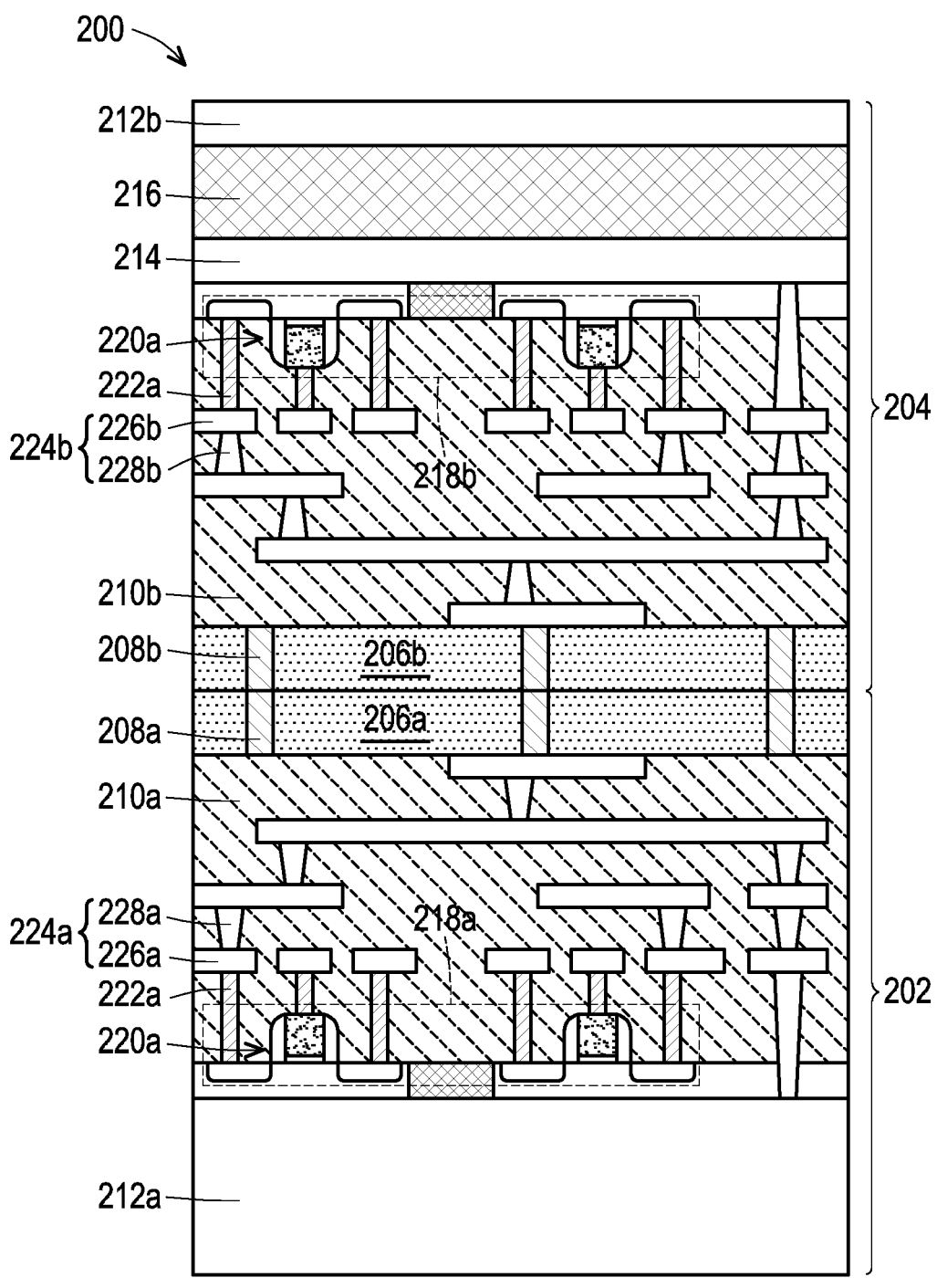
FIG. 2 is a diagram of an example radio frequency (RF) device die described herein.

FIG. 2 is a diagram of an example RF device die 200 described herein. The RF device die 200 may include or may be included in an RF front-end module (FEM), an RF switch, and/or another type of RF device. As shown in FIG. 2, the RF device die 200 may include a logic die 202 and an RF die 204. The logic die 202 may include the logic devices of the RF device die 200, such as processing devices, transistors, and/or another type of logic devices. The RF die 204 may include the RF devices of the RF device die 200, such as RF switches, receivers, and/or another type of RF devices.

The logic die 202 and the RF die 204 may be vertically stacked or vertically arranged. For example, the RF die 204 may be included on the logic die 202. As another example, the logic die 202 may be included on the RF die 204. The logic die 202 and the RF die 204 may be bonded at an interface between a redistribution layer (RDL) structure 206a of the logic die 202 and an RDL structure 206b of the RF die 204. The RDL structures 206a and 206b may include one or more dielectric materials, such as a silicon oxide ($SiO_x$), a silicon nitride ($Si_xN_y$), and/or another dielectric material; one or more insulating materials such as a molding compound; and/or another non-conductive material. The logic die 202 and the RF die 204 may be electrically connected by conductive structures 208a and 208b that extend between the logic die 202 and the RF die 204 through the RDL structure 206a and 206b, respectively. The conductive structures 208a and 208b may include interconnects, through silicon vias (TSVs), through insulator vias (TIVs), and/or another type of conductive structures. The conductive structures 208a and 208b may include copper (Cu), cobalt (Co), titanium (Ti), ruthenium (Ru), and/or another conductive material.

As further shown in FIG. 2, the logic die 202 includes a device layer 210a and a substrate 212a. The RF die 204 includes a device layer 210b and a high-resistance substrate 212b. The RF die 204 further includes an insulator layer 214 and a trapping layer 216. The device layers 210a and 210b each include one or more layers in which devices are included. The devices may include active devices such as transistors and switches, passive devices such as resistors and capacitors, and/or another type of devices. The device layers 210a and 210b may each include silicon (Si), silicon germanium (Si), doped silicon, a silicon oxide ($SiO_x$), a silicon nitride ($Si_xN_y$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), and/or another material. In some implementations, each of the device layers 210a and 210b is included in a range of approximately 10 nanometers to approximately 80 nanometers. However, other values for the range are within the scope of the present disclosure.

The substrate 212a may include silicon (Si), a material including silicon, a III-V compound semiconductor material such as gallium arsenide (GaAs), an SOI material, and/or another material. In some implementations, the substrate 212a is formed of a doped material (e.g., a p-doped material or an n-doped material) such as a doped silicon.

The high-resistance substrate 212b may include a high-resistance handle substrate that has a low-doping concentration. The high-resistance substrate 212b may be formed to a thickness ranging from approximately 200 microns to approximately 1000 microns to provide sufficient structural rigidity to withstand semiconductor processing operations. However, other values for the range are within the scope of the present disclosure. The high-resistance substrate 212b may be formed of a high-resistance silicon to achieve an electrical resistance that is included of approximately 2 kilo-ohms-centimeter (kΩ-cm) to approximately 8 kΩ-cm. However, other values for the range are within the scope of the present disclosure. Alternatively, the high-resistance substrate 212b may be formed of a low-resistance silicon.

The insulator layer 214 may be referred to as a buried oxide (BOX) and may correspond to the insulator in the silicon-on-insulator of the RF die 204. The insulator layer 214 may include a silicon oxide ($SiO_x$) or another oxide material. In some implementations, the insulator layer 214 includes fluorine doped silicon dioxide, carbon-doped silicon dioxide, porous silicon dioxide, porous carbon-doped silicon dioxide, spin-on organic polymeric dielectrics, and/or spin-on silicon based polymeric dielectric, among other examples.

The trapping layer 216 is configured to trap charge carriers in the RF die 204. RF devices in the RF die 204 may excite charge carriers (e.g., electrons and/or holes) in the RF die 204. The trapping layer 216 may trap these excited charge carriers to reduce and/or prevent charge carrier migration into, and accumulation in, the high-resistance substrate 212b. The trapping layer 216 may include polysilicon, a doped polysilicon, and/or another suitable material. The polysilicon of the trapping layer 216 may include one or more dopants such as oxygen (O), carbon (C), nitrogen (N), germanium (Ge), selenium (Se), antimony (Sb), and/or or tellurium (Te), among other examples.

The logic die 202 may include a device region 218a in the device layer 210a. The device region 218a includes semiconductor devices 220a corresponding to the logic devices of the logic die 202. The RF die 204 includes a device region 218b in the device layer 210b. The device region 218b includes semiconductor devices 220b corresponding to the RF devices of the RF die 204. The semiconductor devices 220a in the device region 218a may be electrically connected with middle end of line (MEOL) conductive structures 222a in the device layer 210a. The semiconductor devices 220b in the device region 218b may be electrically connected with MEOL conductive structures 222b in the device layer 210b. The MEOL conductive structures 222a and 222b may include contacts, contact plugs, metal drain (MD) contacts, metal gate on poly contacts (MPs), and/or another type of conductive structures. The MEOL conductive structures 222a and 222b may include copper (Cu), cobalt (Co), titanium (Ti), ruthenium (Ru), and/or another conductive material.

The MEOL conductive structures 222a may be electrically connected with back end of line (BEOL) conductive structures 224a in the device layer 210a. The MEOL conductive structures 222b may be electrically connected with BEOL conductive structures 224b in the device layer 210b. The BEOL conductive structures 224a may be electrically connected with one or more of the conductive structures 208a. The BEOL conductive structures 224b may be electrically connected with one or more of the conductive structures 208b.

The BEOL conductive structures 224 may include one or more metallization layers 226a and vias 228a, such as a metallization layer M0, a via layer V0, a metallization layer M1, a via layer V1, and so on. The BEOL conductive structures 224b may include one or more metallization layers 226b and vias 228b, such as a metallization layer M0, a via layer V0, a metallization layer M1, a via layer V1, and so on. The BEOL conductive structures 224a (including the metallization layers 226a and vias 228a) and the BEOL conductive structures 224b (including the metallization layers 226a and vias 228a) may include copper (Cu), cobalt (Co), titanium (Ti), ruthenium (Ru), and/or another conductive material.

As indicated above, FIG. 2 is provided as an example. Other examples may differ from what is described with regard to FIG. 2.

Figure 3A:
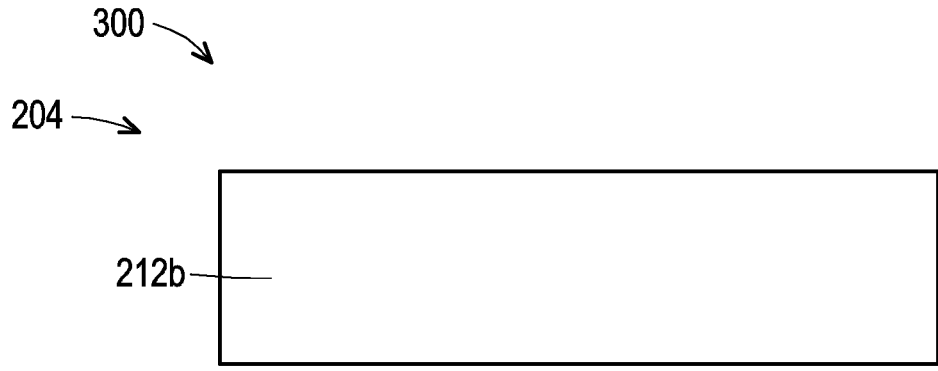
FIGS. 3A-3C are diagrams of an example implementation described herein.
Figure 3B:
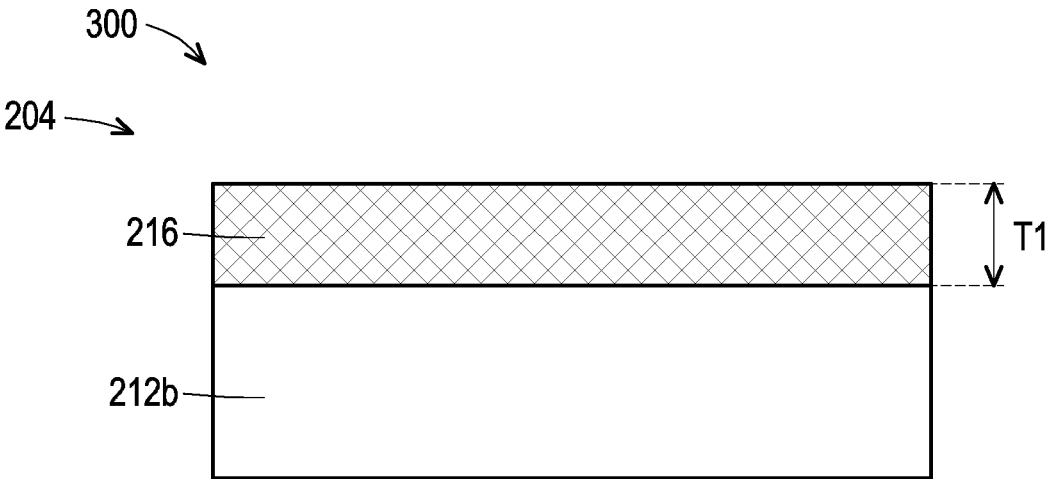
Figure 3C:
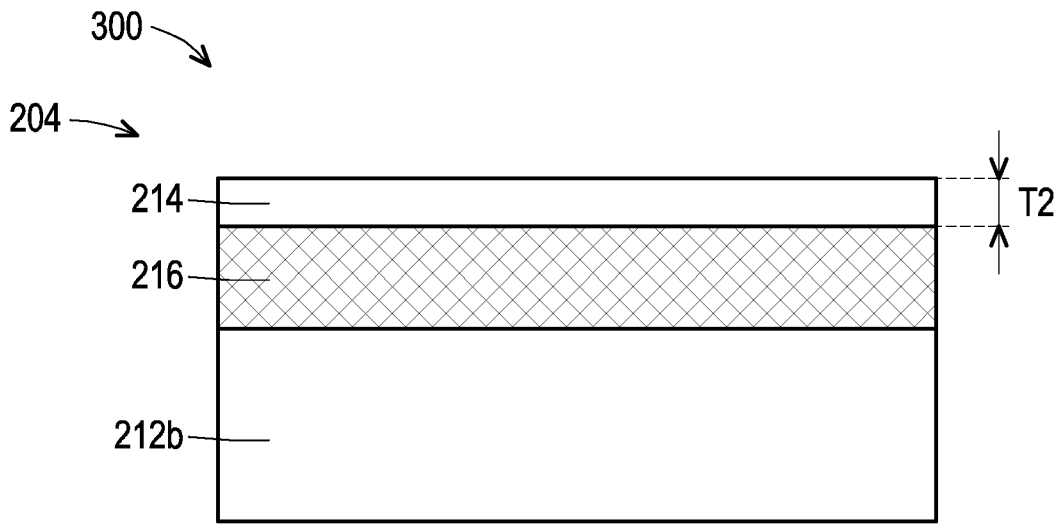

FIGS. 3A-3C are diagrams of an example implementation 300 described herein. The example implementation 300 includes an example of forming a trap-rich SOI portion of the RF die 204 described herein. The trap-rich SOI portion of the RF die 204 may include the high-resistance substrate 212b, the insulator layer 214, and the trapping layer 216.

Turning to FIG. 3A, the high-resistance substrate 212b may be provided. One or more of the semiconductor processing operations of the example implementation 300 may be performed in connection with the high-resistance substrate 212b. The deposition tool 102 deposits the As shown in FIG. 3B, the trapping layer 216 may be formed over and/or on the high-resistance substrate 212b. The trapping layer 216 may be formed of a polysilicon material (e.g., a polycrystalline silicon material), a doped polysilicon material, and/or another type of material. The deposition tool 102 deposits the trapping layer 216 over and/or on the high-resistance substrate 212b. The deposition tool 102 may perform one or more epitaxial operations to epitaxially grow the trapping layer 216 over and/or on the high-resistance substrate 212b.

As further shown in FIG. 3B, the trapping layer 216 may be formed to a thickness T1 over and/or on the high-resistance substrate 212b. The thickness T1 may be included in a range of approximately 200 nanometers to approximately 600 nanometers. However, other values for the range are within the scope of the present disclosure. Forming the trapping layer 216 such that the thickness T1 is included in a range of approximately 200 nanometers to approximately 600 nanometers may result in a relatively small grain size for the material of the trapping layer 216. For example, forming the trapping layer 216 such that the thickness T1 is included in a range of approximately 200 nanometers to approximately 600 nanometers may result in a grain size that is less than or approximately equal to 100 nanometers. In some implementations, the grain size of the material of the trapping layer 216 is included in a range of approximately 20 nanometers to approximately 100 nanometers. Harmonic distortion for the RF device die 200 may be relatively low (e.g., less than approximately −92 decibel-milliwatts (dBM) for second and third harmonics in the RF device die 200) due to the increased charge trapping performance that may result from the grain size of the material of the trapping layer 216 being in this grain size range. The harmonic distortion for the RF device die 200 may significantly increase if the thickness T1 is greater than 600 nanometers or less than 200 nanometers. Moreover, the grain size of the material of the trapping layer 216 being in the range of approximately 20 nanometers to approximately 100 nanometers may reduce the parasitic conduction effect (PSC) in the high-resistance substrate 212b, which may increase the silicon resistivity ($R_{eff}$) of the high-resistance substrate 212b and may reduce cross-talk, reduce parasitic capacitance, and/or reduce harmonic distortion in the RF device die 200.

As shown in FIG. 3C, the insulator layer 214 may be formed over and/or on the trapping layer 216. The deposition tool 102 may deposit the insulator layer 214 using a CVD technique, an ALD technique, a PVD technique, an oxidation technique (e.g., a thermal oxidation technique), and/or another suitable deposition technique. In some implementations, the insulator layer 214 is formed to a thickness T2 that is included in a range of approximately 50 nanometers to approximately 400 nanometers to provide electrical isolation between the device layer 210b and the high-resistance substrate 212b. However, other values for the range are within the scope of the present disclosure.

As indicated above, FIGS. 3A-3C are provided as an example. Other examples may differ from what is described with regard to FIGS. 3A-3C.

Figure 4A:
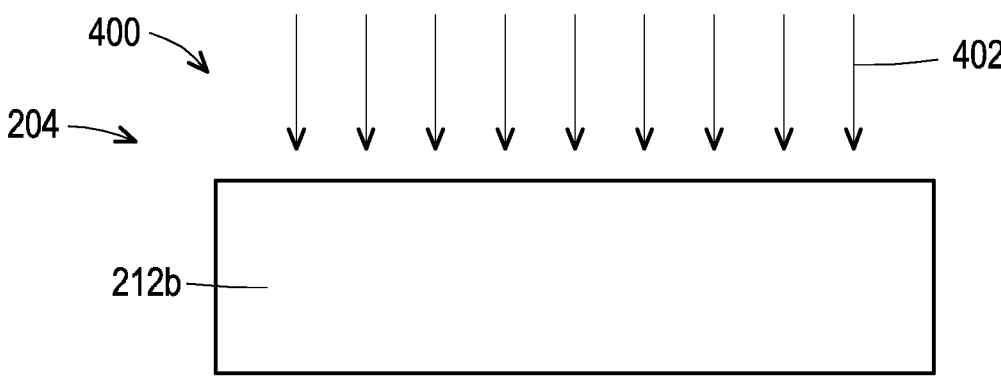
FIGS. 4A-4C are diagrams of an example implementation described herein.
Figure 4B:
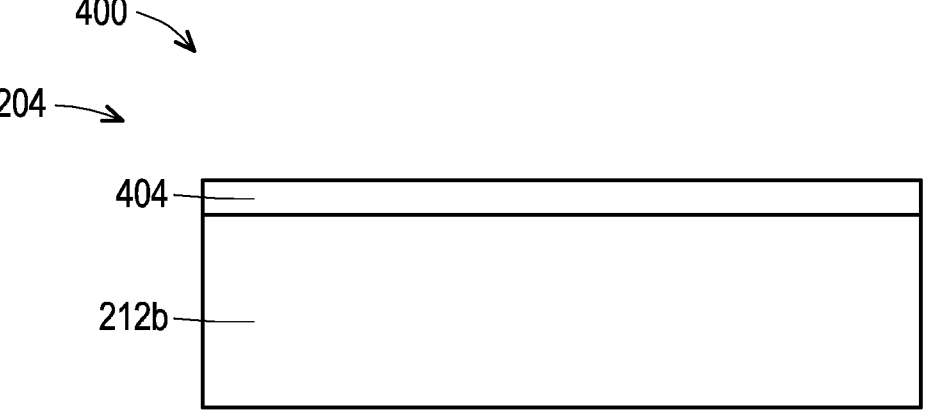
Figure 4C:
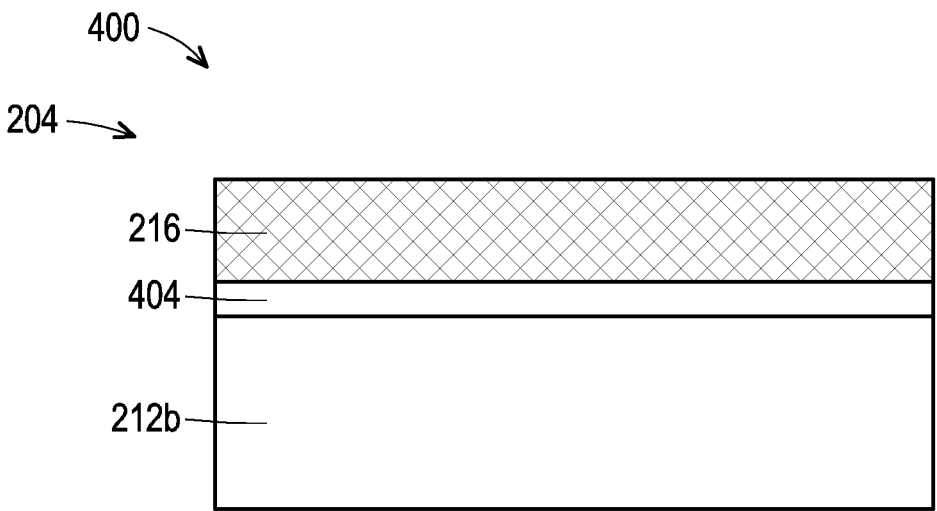

FIGS. 4A-4C are diagrams of an example implementation 400 described herein. The example implementation 400 includes an example of forming the trapping layer 216. The operations and/or techniques described in connection with the example implementation 400 may be performed in the example implementation 300 described above to form the trapping layer 216 over and/or on the high-resistance substrate 212b.

As shown in FIG. 4A, an etchant 402 may be used to etch the top surface of the high-resistance substrate 212b prior to formation of the trapping layer 216. The etchant 402 may include a hydrochloric acid (HCl) and/or another suitable etchant. The etch tool 108 may use the etchant 402 to etch the top surface of the high-resistance substrate 212b to damage the silicon in the top surface to facilitate the formation of a smaller grain size in the trapping layer 216 that is to be formed on the top surface of the high-resistance substrate 212b. The damage caused to the silicon in the top surface may increase the quantity of nucleation sites in the top surface, which may increase the rate of nucleation during deposition of the trapping layer 216.

As shown in FIG. 4B, a seed layer 404 may be formed on the top surface of the high-resistance substrate 212b. For example, the deposition tool 102 may deposit the seed layer 404 on the top surface of the high-resistance substrate 212b after the etch tool 108 etches the top surface using the etchant 402. The deposition tool 102 may use a CVD technique, an ALD technique, a PVD technique, and/or anther suitable deposition technique to deposit the seed layer 404. The seed layer 404 may include the same material or a similar material as the trapping layer 216 that is to be formed on the seed layer 404. For example, the seed layer 404 may include a polysilicon material and/or another suitable material.

As shown in FIG. 4C, the trapping layer 216 may be formed over and/or on the seed layer 404. The deposition tool 102 may perform one or more epitaxial operations to epitaxially grow the trapping layer 216 on the seed layer 404. The seed layer 404 may promote and/or increase adhesion between the trapping layer 216 and the high-resistance substrate 212, and may provide a material on which the trapping layer 216 may be epitaxially grown to achieve a particular grain size and/or a particular grain orientation.

In some implementations, the deposition tool 102 deposits the trapping layer 216 at a relatively low temperature. For example, the deposition tool 102 deposits the trapping layer 216 at a temperature that is included in a range of approximately 550 degrees Celsius to approximately 700 degrees Celsius to achieve a suitable growth rate and grain size for the trapping layer 216, such as a grain size that is less than approximately 100 nanometers. However, other values for the range are within the scope of the present disclosure.

As described above, the polysilicon of the trapping layer 216 may be doped with one or more types of dopants such as oxygen (O), carbon (C), nitrogen (N), germanium (Ge), selenium (Se), antimony (Sb), and/or or tellurium (Te), among other examples. The dopant(s) in the trapping layer 216 may trap silicon interstitials in the trapping layer 216 to slow the growth of silicon in the trapping layer 216. The reduced growth rate may enable the trapping layer 216 to be grown at a rate that achieves a relatively small grain size in the trapping layer 216. The use of dopants in the trapping layer 216, in combination with the low temperature deposition of the trapping layer 216, may enable the trapping layer 216 to be formed with a small grain size of less than or approximately equal to 100 nanometers.

The dopant concentration in the trapping layer 216 may be included in a range of approximately $5 \times 10^{19}$ atoms per cubic centimeter to approximately $5 \times 10^{20}$ atoms per cubic centimeter to reduce grain growth in the polysilicon material of the trapping layer 216 while providing a sufficiently low likelihood of dopant segregation in the trapping layer 216 (dopant segregation may cause increased surface roughness). However, other values for the range are within the scope of the present disclosure.

In some implementations, the polysilicon material of the trapping layer 216 is doped "in-situ," meaning that dopants are introduced into the polysilicon material of the trapping layer 216 as the polysilicon material is deposited onto the seed layer 404. Additionally and/or alternatively, the ion implantation tool 114 may perform one or more implantation operations to implant the dopants (referred to as "ex-situ" doping) after the trapping layer 216 is deposited.

As indicated above, FIGS. 4A-4C are provided as an example. Other examples may differ from what is described with regard to FIGS. 4A-4C.

Figure 5:
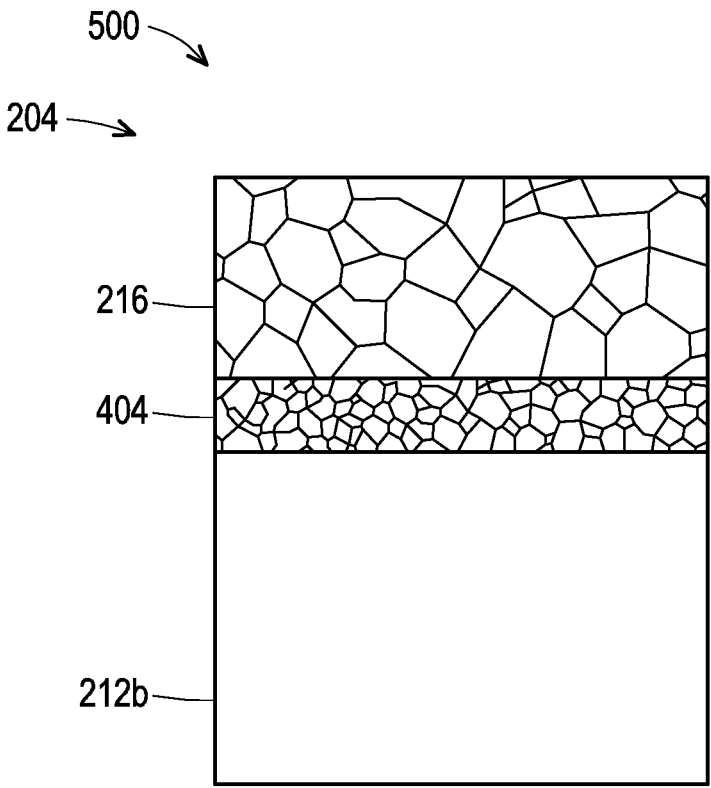
FIG. 5 is a diagram of an example implementation described herein.

FIG. 5 is a diagram of an example implementation 500 described herein. The example implementation 500 includes an example of grain sizes in the RF die 204. As shown in FIG. 5, the seed layer 404 may be included on the high-resistance substrate 212b, and the trapping layer 216 may be included on the seed layer 404. The seed layer 404 may have a grain size that is less than the grain size of the trapping layer 216. For example, the grain size of the seed layer 404 may be less than approximately 50 nanometers, whereas the grain size of the trapping layer 216 may be less than approximately 100 nanometers. However, other values for the grain sizes of the seed layer 404 and of the trapping layer 216 are within the scope of the present disclosure.

As indicated above, FIG. 5 is provided as an example. Other examples may differ from what is described with regard to FIG. 5.

FIGS. 6A-6D are diagrams of an example implementation 600 described herein. The example implementation 600 may include an example of forming the device layer 210b that is to be attached to the insulator layer 214 of the RF die 204. The device layer 210b is formed on a device substrate and is subsequently bonded to the insulator layer 214 as opposed to forming the insulator layer 214 on a bulk silicon substrate and cutting the bulk silicon substrate to form the device layer 210b. In this way, the cutting operation may be omitted. The omission of the cutting operation may reduce the likelihood of damage being caused to the device layer 210b, and may therefore reduce the need for high-temperature processing to remove the damage. This enables the trapping layer 216 to be formed to a lesser thickness T1 than if the high-temperature processing to remove the damage were to be performed, which may enable a relatively small grain size in the trapping layer 216 to be achieved for increased RF performance in the RF device die 200.

Turning to 6A, processing operations in the example implementation 600 may be performed in connection with a device wafer 602. The device wafer 602 may be separate from the high-resistance substrate 212b. A device substrate 604 may be provided for the device wafer 602. The device substrate 604 may include a silicon (Si) substrate, a doped silicon substrate (e.g., a P+ doped silicon substrate, a P– doped silicon substrate), and/or another type of substrate.

Figure 6A:
FIGS. 6A-6D are diagrams of an example implementation described herein.
Figure 6B:
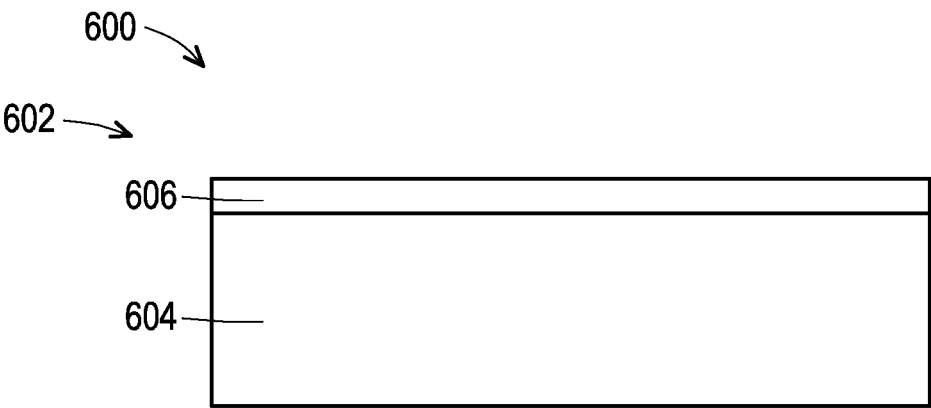

As shown in FIG. 6B, an epitaxial layer 606 may be formed over and/or on the device substrate 604. The epitaxial layer 606 may be formed of a silicon material, a doped silicon material (e.g., a P+ doped material substrate, a P– doped material substrate), and/or another type of material. The deposition tool 102 may deposit the epitaxial layer 606 over and/or on the device substrate 604. The deposition tool 102 may perform one or more epitaxial operations to epitaxially grow the epitaxial layer 606 over and/or on the device substrate 604.

Figure 6C:
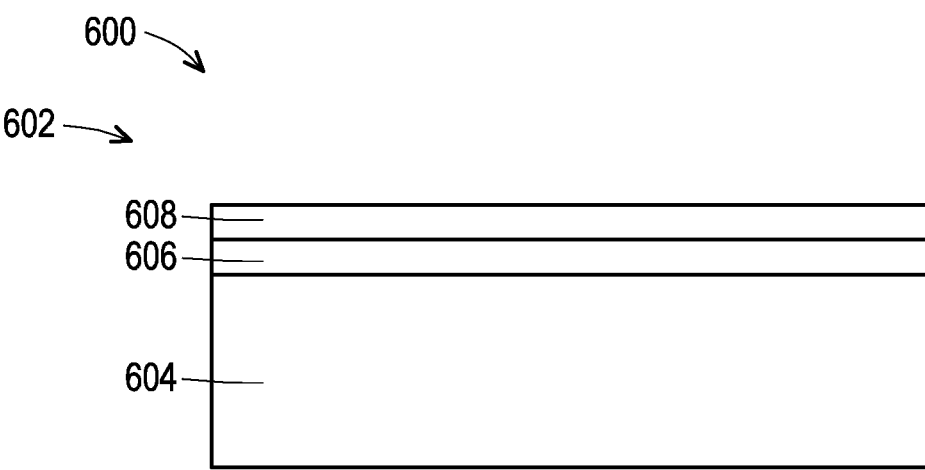

As shown in FIG. 6C, an etch stop layer 608 may be formed over and/or on the epitaxial layer 606. The deposition tool 102 may use a CVD technique, an ALD technique, a PVD technique, and/or anther suitable deposition technique to deposit the etch stop layer 608 over and/or on the epitaxial layer 606. The etch stop layer 608 may include silicon germanium (SiGe), a silicon nitride ($Si_xN_y$), and/or another suitable material.

Figure 6D:
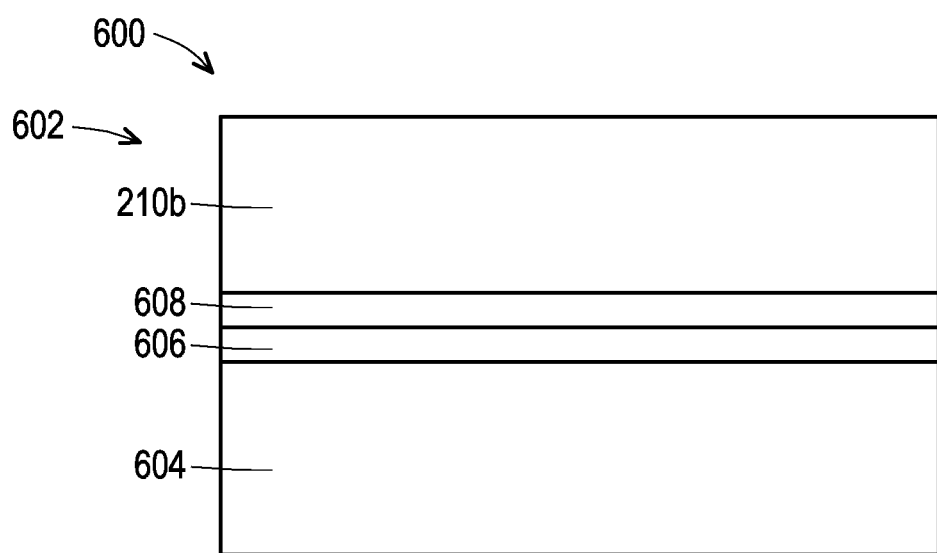

As shown in FIG. 6D, the device layer 210b may be formed over and/or on the etch stop layer 608. The deposition tool 102 may use a CVD technique, an ALD technique, a PVD technique, an epitaxy technique, and/or anther suitable deposition technique to deposit the device layer 210b over and/or on the etch stop layer 608. In some implementations, the device layer 210b is formed to a thickness that is include in a range of approximately 110 nanometers to approximately 150 nanometers. However, other values for the range are within the scope of the present disclosure.

As indicated above, FIGS. 6A-6D are provided as an example. Other examples may differ from what is described with regard to FIGS. 6A-6D.

FIGS. 7A-7D are diagrams of an example implementation 700 described herein. The example implementation 700 may include an example of attaching the device layer 210b to the insulator layer 214 of the RF die 204.

Figure 7A:
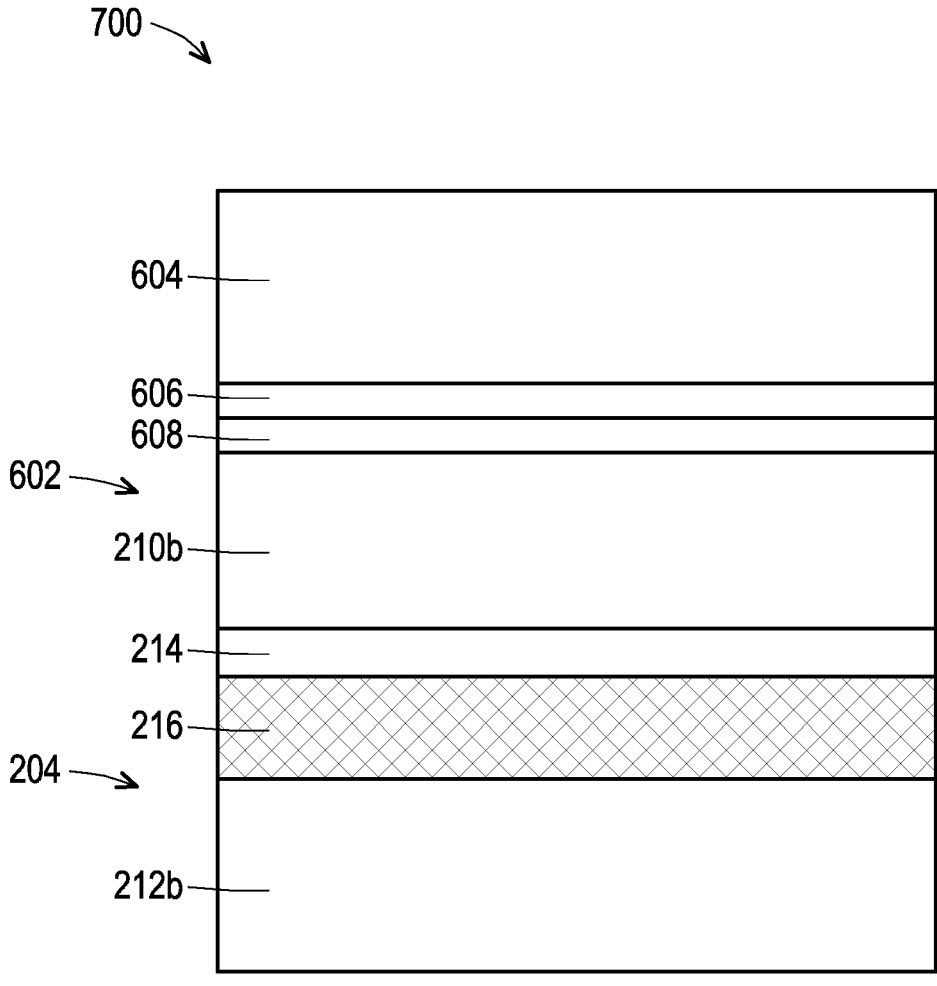
FIGS. 7A-7D are diagrams of an example implementation described herein.

As shown in FIG. 7A, the device wafer 602 and the RF die 204 may be bonded. The device wafer 602 and the RF die 204 may be bonded such that the device wafer 602 and the RF die 204 are vertically stacked or vertically arranged. The bonding tool 116 may perform a bonding operation to bond the device wafer 602 and the RF die 204 by bonding the device layer 210b of the device wafer 602 and the insulator layer 214 of the RF die 204. The bonding operation may include a direct bonding operation, a hybrid bonding operation, and/or another type of bonding operation.

Figure 7B:
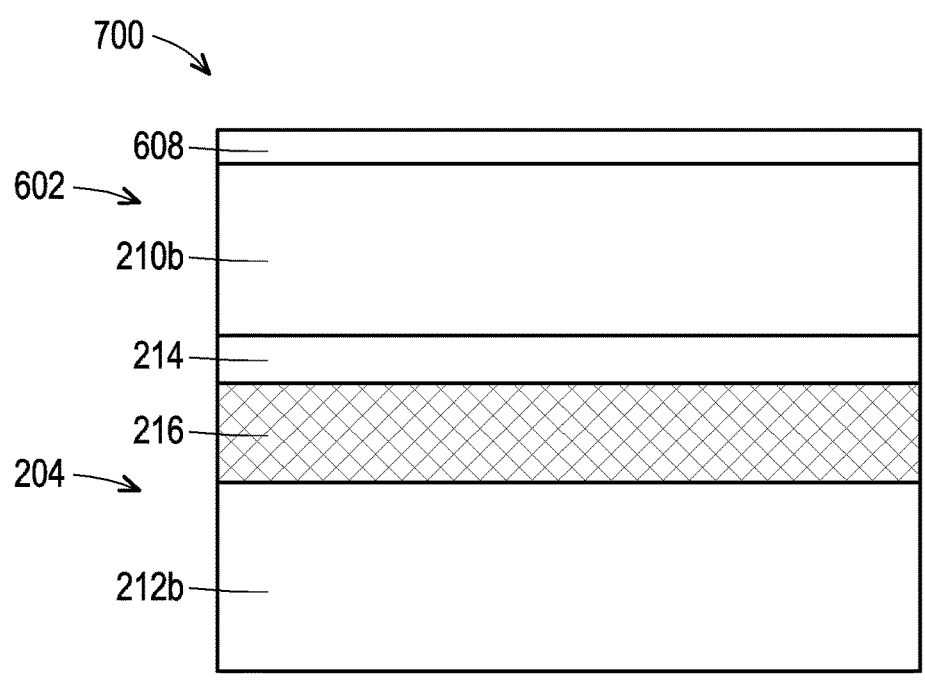

As shown in FIG. 7B, the device substrate 604 and the epitaxial layer 606 may be removed from the device wafer 602 (e.g., after the device wafer 602 and the RF die 204 are bonded). In some implementations, the planarization tool 110 may perform a planarization operation to reduce a thickness of the device substrate 604 prior to removal of the device substrate 604. In some implementations, the planarization tool 110 removes the device substrate 604 and/or the epitaxial layer 606 by performing a planarization operation to grind or CMP the device substrate 604 and/or the epitaxial layer 606 from the etch stop layer 608. In some implementations, the etch tool 108 uses one or more etchants to etch the device substrate 604 and/or the epitaxial layer 606 to remove the device substrate 604 and/or the epitaxial layer 606. The etch stop layer 608 may prevent the one or more etchants from etching into the device layer 210b. The one or more etchants may include a combination of hydrofluoric, nitric, and acetic acid (HNA), tetramethylammonium hydroxide (TMAH), and/or another suitable etchant.

Figure 7C:
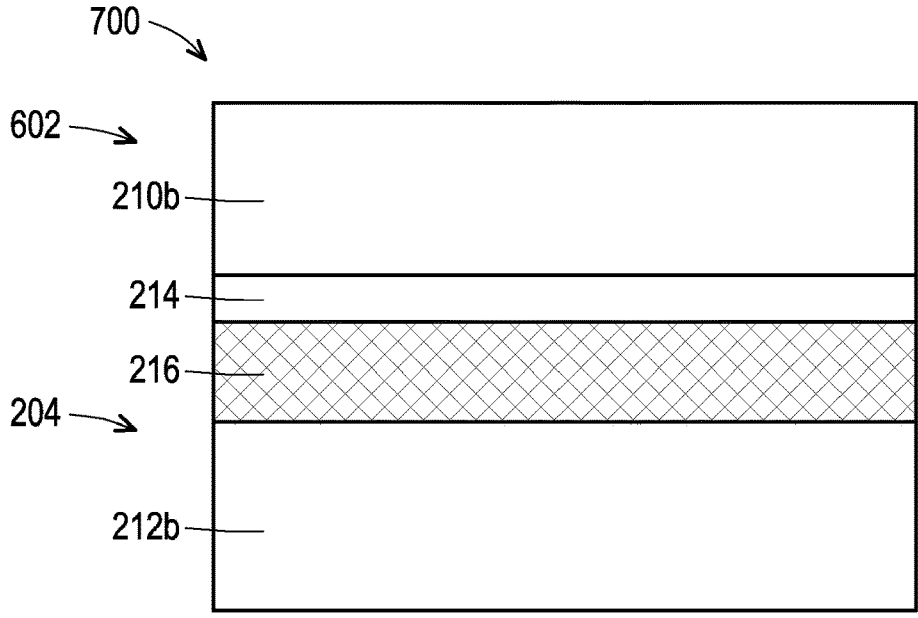

As shown in FIG. 7C, the etch stop layer 608 may be removed from the device wafer 602. In some implementations, the planarization tool 110 removes the etch stop layer 608 by performing a planarization operation to grind or CMP the etch stop layer 608 from the device layer 210b. In some implementations, the etch tool 108 uses one or more etchants to etch the etch stop layer 608 to remove the etch stop layer 608 from the device layer 210b.

Figure 7D:
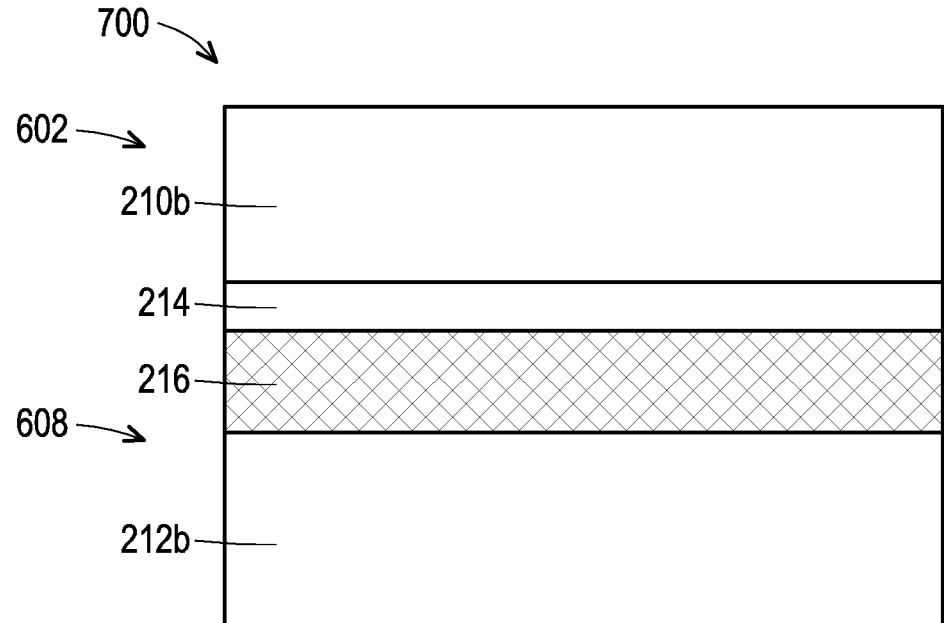

As shown in FIG. 7D, the thickness of the device layer 210b may be reduced after removal of the etch stop layer 608. This operation may be referred to as a final thinning operation. Here, the planarization tool 110 may perform a planarization operation to remove material from the device layer 210b to achieve a substantially flat and smooth top surface for the device layer 210b. The thickness of the device layer 210b may be included in a range of approximately 10 nanometers to approximately 80 nanometers after the final thinning operation.

As indicated above, FIGS. 7A-7D are provided as an example. Other examples may differ from what is described with regard to FIGS. 7A-7D.

Figure 8:
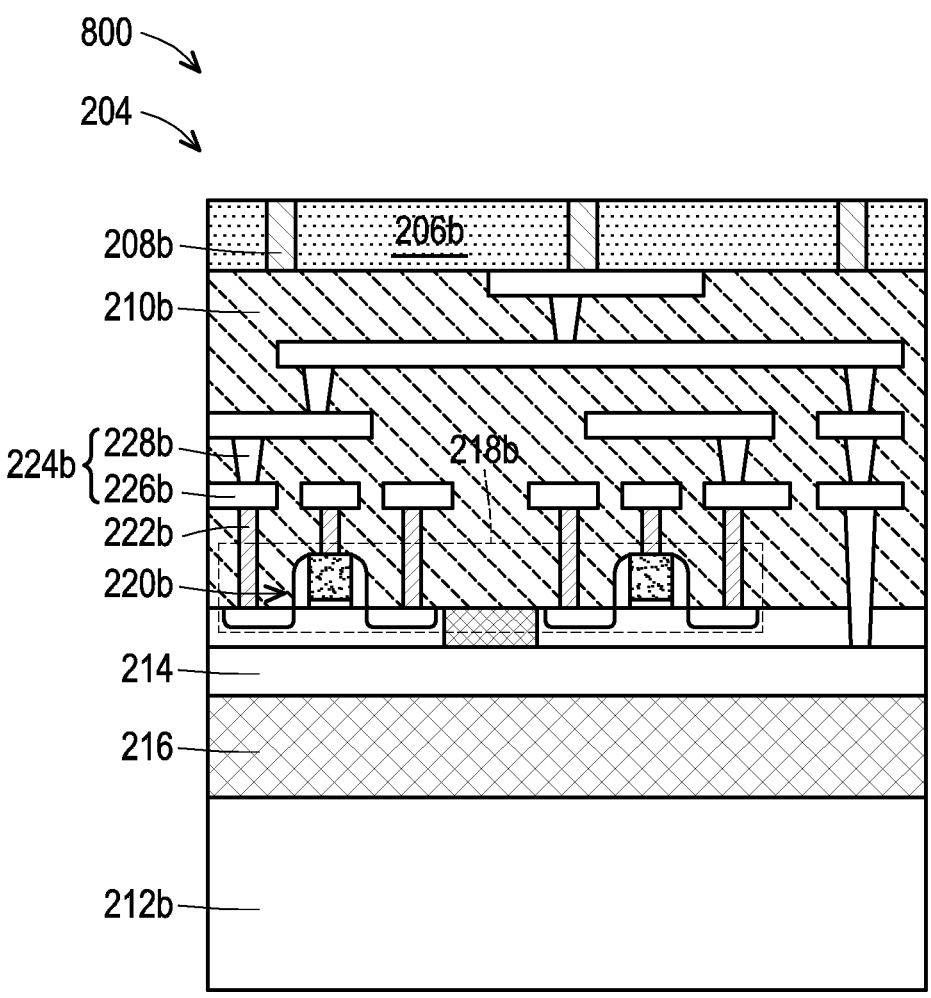
FIG. 8 is a diagram of an example implementation described herein.

FIG. 8 is a diagram of an example implementation 800 described herein. The example implementation 800 includes an example of additional processing operations that may be performed to form the RF die 204.

As shown in FIG. 8, the semiconductor devices 220b may be formed in the device region 218b in the device layer 210b. One or more of the semiconductor processing tools 102-116 may perform various types of semiconductor processing operations to form transistors, capacitors, resistors, switches, and/or another type of electrical components in the device region 218b.

As further shown in FIG. 8, MEOL conductive structures 222b may be formed to electrically connect with the semiconductor devices 220b in the device region 218b. One or more of the semiconductor processing tools 102-116 may perform various types of semiconductor processing operations to form contacts, plugs, vias, and/or another type of conductive structures for the MEOL conductive structures 222b.

As further shown in FIG. 8, BEOL conductive structures 224b may be formed to electrically connect with the MEOL conductive structures 222b. One or more of the semiconductor processing tools 102-116 may perform various types of semiconductor processing operations to form metallization layers 226b, vias 228b, and/or another type of conductive structures for the BEOL conductive structures 224b.

As further shown in FIG. 8, the RDL structure 206b may be formed over and/or on the device layer 210b. In some implementations, the deposition tool 102 deposits the RDL structure 206b over and/or on the device layer 210b. The conductive structures 208b may be formed in the RDL structure 206b. The conductive structures 208b may be formed by forming opening in the RDL structure 206b, and forming the conductive structures 208b in the openings.

In some implementations, a pattern in a photoresist layer is used to form the recesses in the RDL structure 206b. In these implementations, the deposition tool 102 forms the photoresist layer on the RDL structure 206b. The exposure tool 104 exposes the photoresist layer to a radiation source to pattern the photoresist layer. The developer tool 106 develops and removes portions of the photoresist layer to expose the pattern. The etch tool 108 performs an etch operation to etch into the RDL structure 206b to form the openings in the RDL structure 206b. In some implementations, the etch operation includes the use of a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

The deposition tool 102 and/or the plating tool 112 may deposit the conductive structures 208b using a CVD technique, a PVD technique, an ALD technique, an electroplating technique, another deposition technique described above in connection with FIG. 1, and/or another suitable deposition technique.

As indicated above, FIG. 8 is provided as an example. Other examples may differ from what is described with regard to FIG. 8.

Figure 9A:
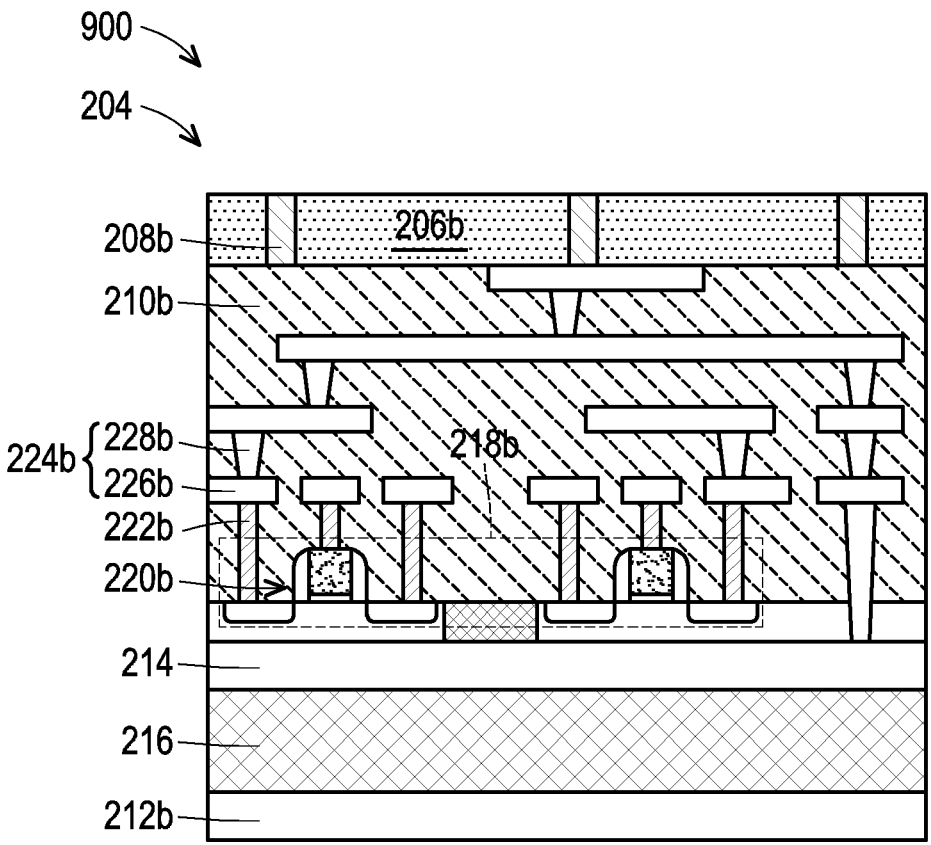
FIGS. 9A-9C are diagrams of an example implementation described herein.
Figure 9B:
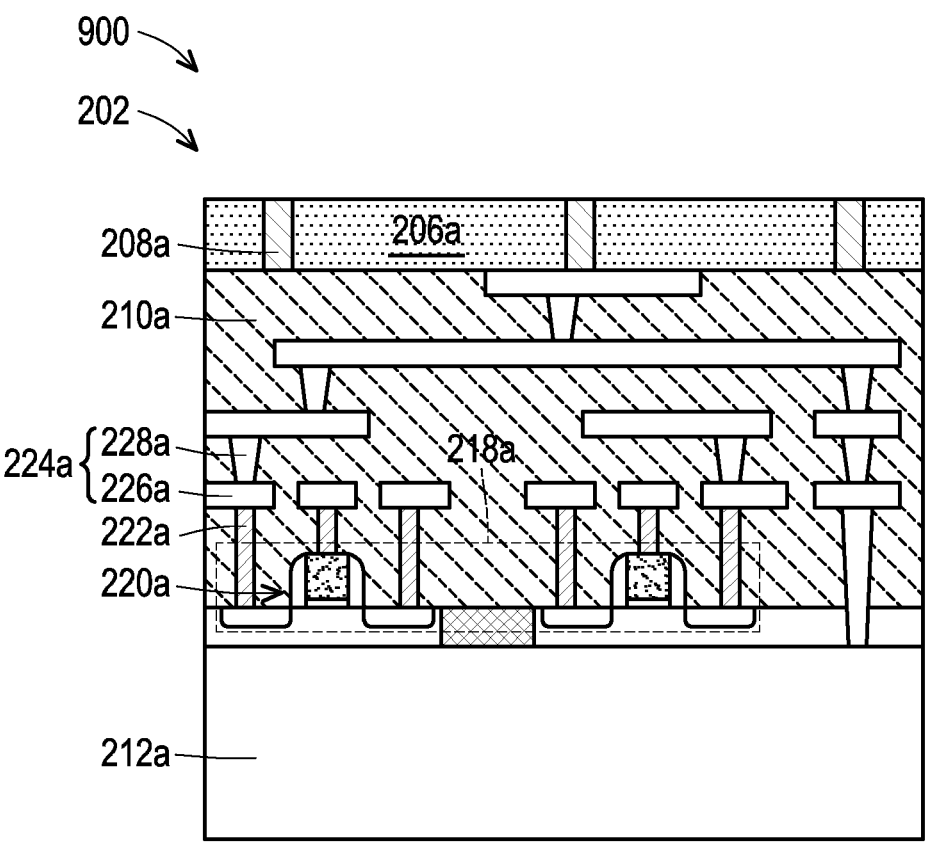
Figure 9C:
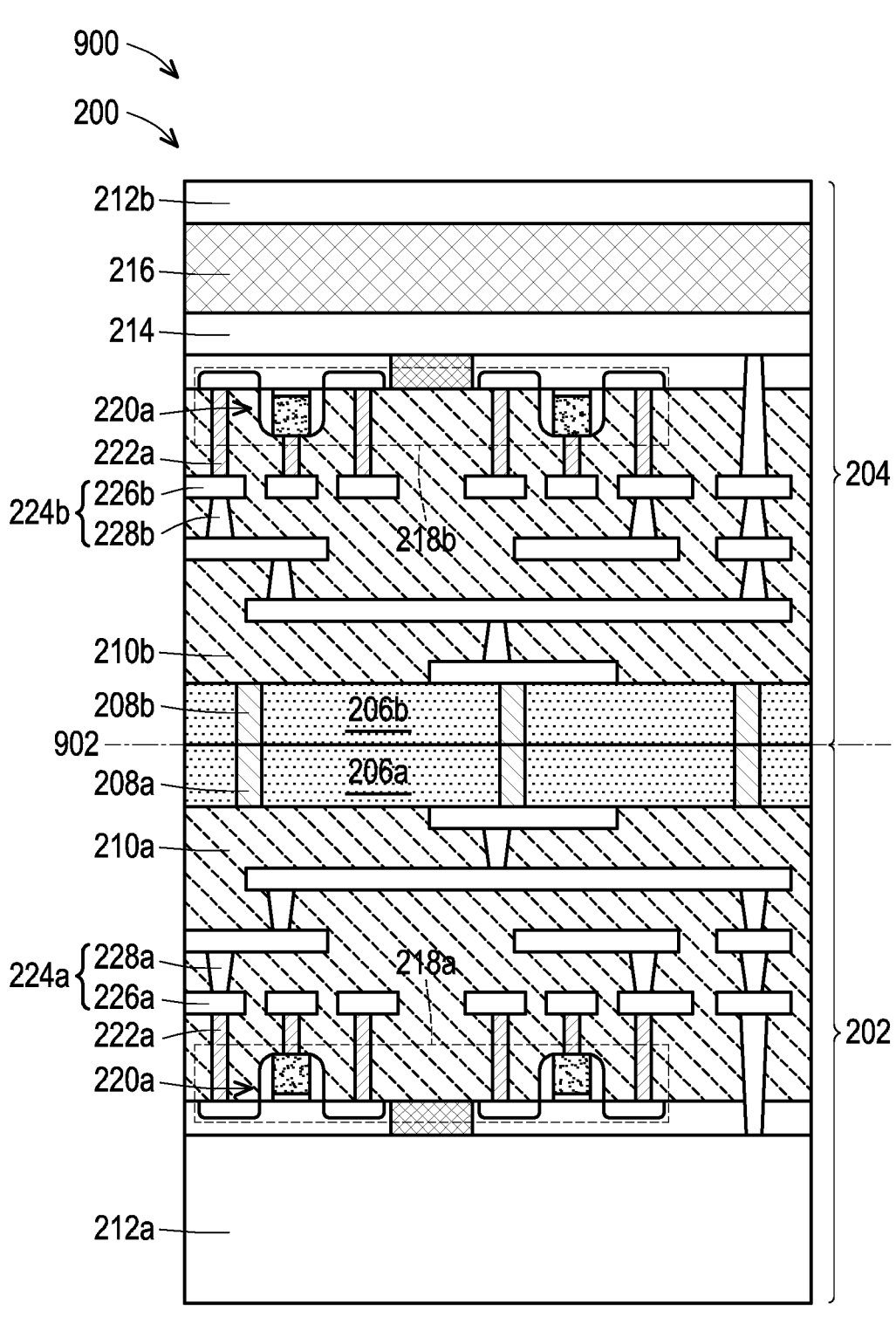

FIGS. 9A-9C are diagrams of an example implementation 900 described herein. The example implementation 900 may include an example of bonding the logic die 202 and the RF die 204 to form the RF device die 200.

As shown in FIG. 9A, the thickness of the high-resistance substrate 212b may be reduced. In some implementations, the thickness of the high-resistance substrate 212b is reduced prior to bonding of the logic die 202 and the RF die 204. Additionally and/or alternatively, the thickness of the high-resistance substrate 212b is reduced after bonding of the logic die 202 and the RF die 204. The planarization tool 110 may perform a planarization operation to reduce the thickness of the high-resistance substrate 212b. The removed portion of the high-resistance substrate 212b may be referred to as a sacrificial layer or sacrificial portion of the high-resistance substrate 212b.

As shown in FIG. 9B, one or more of the semiconductor processing tools 102-116 may perform various semiconductor processing operations to form the logic die 202. For example, one or more of the semiconductor processing tools 102-116 may form the device layer 210a over and/or on the substrate 212a. As another example, one or more of the semiconductor processing tools 102-116 may form semiconductor devices 220a in the device region 218a in the device layer 210a. As another example, one or more of the semiconductor processing tools 102-116 may form MEOL conductive structures 222a in the device layer 210a such that the MEOL conductive structures 222a are electrically connected with the semiconductor device 220a. As another example, one or more of the semiconductor processing tools 102-116 may form BEOL conductive structures 224a in the device layer 210a such that the BEOL conductive structures 224a are electrically connected with the MEOL conductive structures 222a. As another example, one or more of the semiconductor processing tools 102-116 may form the RDL structure 206a over and/or on the device layer 210a. As another example, one or more of the semiconductor processing tools 102-116 may form conductive structures 208a in the RDL structure 206a.

As shown in FIG. 9C, the logic die 202 and the RF die 204 may be bonded such that the logic die 202 and the RF die 204 are vertically stacked or vertically arranged in the RF device die 200. In other words, the RF die 204 may be stacked or positioned on top of the logic die 202, or the logic die 202 may be stacked or positioned on top of the RF die 204.

The bonding tool 116 may perform a bonding operation to bond the logic die 202 and the RF die 204 at a bonding interface 902. The bonding interface 902 may be located at an interface between the RDL structure 206a and the RDL structure 206b. Thus, the logic die 202 and the RF die 204 are bonded at an interface between the RDL structure 206a and the RDL structure 206b such that the conductive structures 208a and the conductive structures 208b are electrically connected. The bonding operation may include a direct bonding operation, a hybrid bonding operation, and/or another suitable bonding operation. The bonding tool 116 may include annealing the logic die 202 and the RF die 204 to promote bonding of the logic die 202 and the RF die 204 at the interface 902. In some implementations, the annealing temperature may be relatively low and included in a range of approximately 400 degrees Celsius to approximately 600 degrees Celsius. However, other values for the range are within the scope of the present disclosure.

As indicated above, FIGS. 9A-9C are provided as an example. Other examples may differ from what is described with regard to FIGS. 9A-9C.

Figure 10:
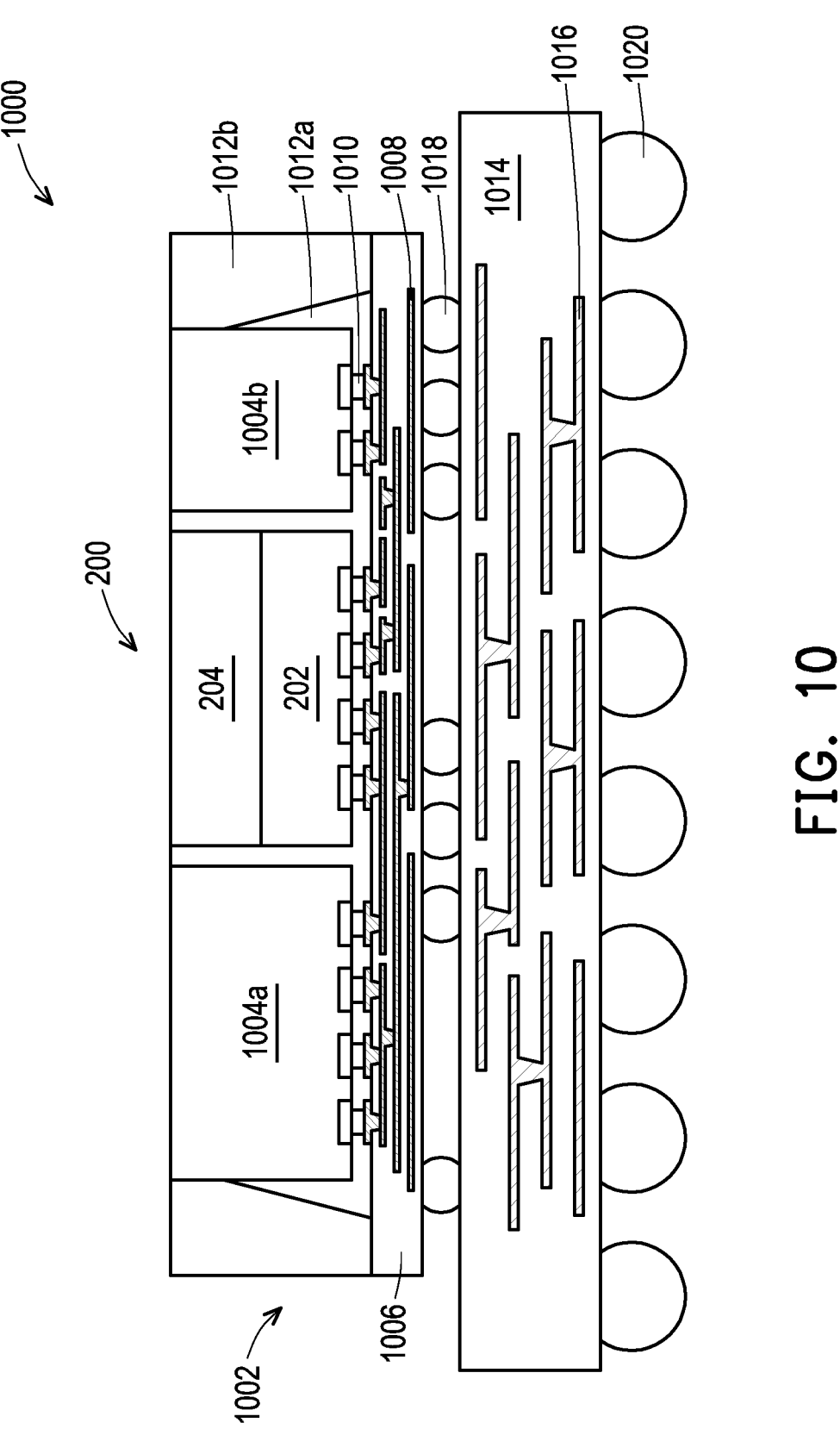
FIG. 10 is a diagram of an example semiconductor device package described herein.

FIG. 10 is a diagram of an example semiconductor device package 1000 described herein. In some implementations, the semiconductor device package 1000 corresponds to an electronic device package, which may include a processing device such as a central processing unit (CPU), a graphics processing unit (GPU), a microprocessor, an RF processor, an RF front-end module, and/or another type of processing device.

The semiconductor device package 1000 may include a multi-die package 1002. The multi-die package 1002 may be referred to a multi-die wafer-level package, an integrated fanout (InFo) package, a chip on wafer (CoW) package, and/or another type of multi-die package. The multi-die package 1002 may include a plurality of integrated circuit (IC) dies 1004a, 1004b, and so on. The IC dies may include a system-on-chip (SoC) die, a dynamic random access memory (DRAM) die, a logic die, an input/output (I/O) die, a static random access memory (SRAM) die, a high bandwidth memory (HBM) die, and/or another type of IC die. The multi-die package 1002 may also include the RF device die 200.

The IC dies 1004a, 1004b, and the RF device die 200 may be attached to an interposer 1006 having one or more layers of electrically-conductive traces 1008 disposed in an insulating material. The insulating material of the interposer 1006 may include one or more layers of a dielectric material, such as a ceramic material, a silicon material, and/or another type of dielectric material. In some implementations, the interposer 1006 is referred to as an RDL structure that includes a plurality of RDLs (corresponding to the electrically-conductive traces 1008) disposed in a plurality of polymer material (PM) layers.

The electrically-conductive traces 1008 may include one or more materials such as a gold (Au) material, a copper (Cu) material, a silver (Ag) material, a nickel (Ni) material, a tin (Sn) material, or a palladium (Pd) material, among other examples. In some implementations, the interposer 1006 includes one or more conductive vertical access connection structures (vias) that connect one or more layers of the electrically-conductive traces 1008.

As shown in FIG. 10, the IC dies 1004a, 1004b, and the RF device die 200 may be attached to an interposer 1006 by a plurality of connection structures 1010. The connection structures 1010 may include one or more combinations of a stud, a pillar, a bump, or a solder ball, among other examples. The connection structures 1010 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

The connection structures 1010 may connect lands (e.g., pads) on bottom surfaces of the IC dies 1004a, 1004b, and the RF device die 200 to lands on a top surface of the interposer 1006. In some implementations, the connection structures 1010 may include one or more electrical connections for signaling (e.g., corresponding lands of the IC dies 1004a, 1004b, the RF device die 200, and the interposer 1006 are electrically connected to respective circuitry and/or traces of the IC dies 1004a, 1004b, the RF device die 200, and the interposer 1006).

In some implementations, the connection structures 1010 may include one or more mechanical connections for attachment purposes and/or spacing purposes (e.g., corresponding lands of the IC dies 1004a, 1004b, the RF device die 200, and the interposer 1006 are not electrically connected to respective circuitry and/or traces of the IC dies 1004a, 1004b, the RF device die 200, and the interposer 1006). In some implementations, one or more of the connection structures 1010 may function both electrically and mechanically.

One or more encapsulating layers may encapsulate one or more portions of the multi-die package 1002, including portions of the IC dies 1004a, 1004b, and the RF device die 200. For example, the one or more encapsulating layers may include an underfill (UF) layer 1012a that fills in around the connection structures 1010 to provide electrical isolation and structural support. As anther example, the one or more encapsulating layers may include a molding compound (MC) layer 1012b that fills in gaps between the IC dies 1004a, 1004b, and the RF device die 200.

The semiconductor device package 1000 may include a substrate 1014 having one or more layers of electrically-conductive traces 1016. The substrate 1014 may be referred to as a package substrate and may include one or more layers of a dielectric material, such as a ceramic material or a silicon material, among other examples. The multi-die package 1002 may be attached and/or supported by the substrate 1014. The combination of the multi-die package 1002 and the substrate 1014 may be referred to as a chip on wafer on substrate (CoWoS) package or another type of semiconductor device package.

The electrically-conductive traces 1016 may include one or more materials such as a gold (Au) material, a copper (Cu) material, a silver (Ag) material, a nickel (Ni) material, a tin (Sn) material, or a palladium (Pd) material, among other examples. In some implementations, the substrate 1014 includes one or more conductive vertical access connection structures (vias) that connect one or more layers of the electrically-conductive traces 1016.

The interposer 1006 may be connected (e.g., mounted) to the substrate 1014 using a plurality of connection structures 1018. The connection structures 1018 may include one or more combinations of a stud, a pillar, a bump, or a solder ball, among other examples. In some implementations, the connection structures 1018 correspond to controlled collapse chip connection (C4) connection structures, under bump metallurgy (UBM) connection structures, and/or another type of connection structures. The connection structures 1018 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

The connection structures 1018 may connect lands (e.g., pads) on a bottom surface of the interposer 1006 to lands on a top surface of the substrate 1014. In some implementations, the connection structures 1018 may include one or more electrical connections for signaling (e.g., corresponding lands of the interposer 1006 and the substrate 1014 are electrically connected to respective circuitry and/or traces of the interposer 1006 and the substrate 1014). In some implementations, the connection structures 1018 may include or more mechanical connections for attachment purposes and/or spacing purposes (e.g., corresponding lands of the interposer 1006 and the substrate 1014 are not electrically connected to respective circuitry and/or traces of the interposer 1006 and the substrate 1014). In some implementations, one or more of the connection structures 1018 may function both electrically and mechanically.

The semiconductor device package 1000 may include a plurality of connection structures 1020 connected to lands (e.g., pads) on a bottom surface of the substrate 1014. The connection structures 1020 may include one or more combinations of a stud, a pillar, a bump, or a solder ball, among other examples. The connection structures 1020 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

The connection structures 1020 may be used to attach the semiconductor device package 1000 to a circuit board (not shown) using a surface mount (SMT) process. In some implementations, the connection structures 1020 may provide an electrical connection for signaling (e.g., corresponding lands of the substrate 1014 and the circuit board may be electrically connected to respective circuitry and/or traces of the substrate 1014 and the circuit board). In some implementations, the connection structures 1020 may provide a mechanical connection to the circuit board for attachment purposes and/or spacing purposes (e.g., corresponding lands of the substrate 1014 and the circuit board may not be electrically connected to respective circuitry and/or traces of the substrate 1014 and the circuit board). In some implementations, one or more of the connection structures 1020 may provide both mechanical and electrical connections.

As indicated above, FIG. 10 is provided as an example. Other examples may differ from what is described with regard to FIG. 10.

Figure 11:
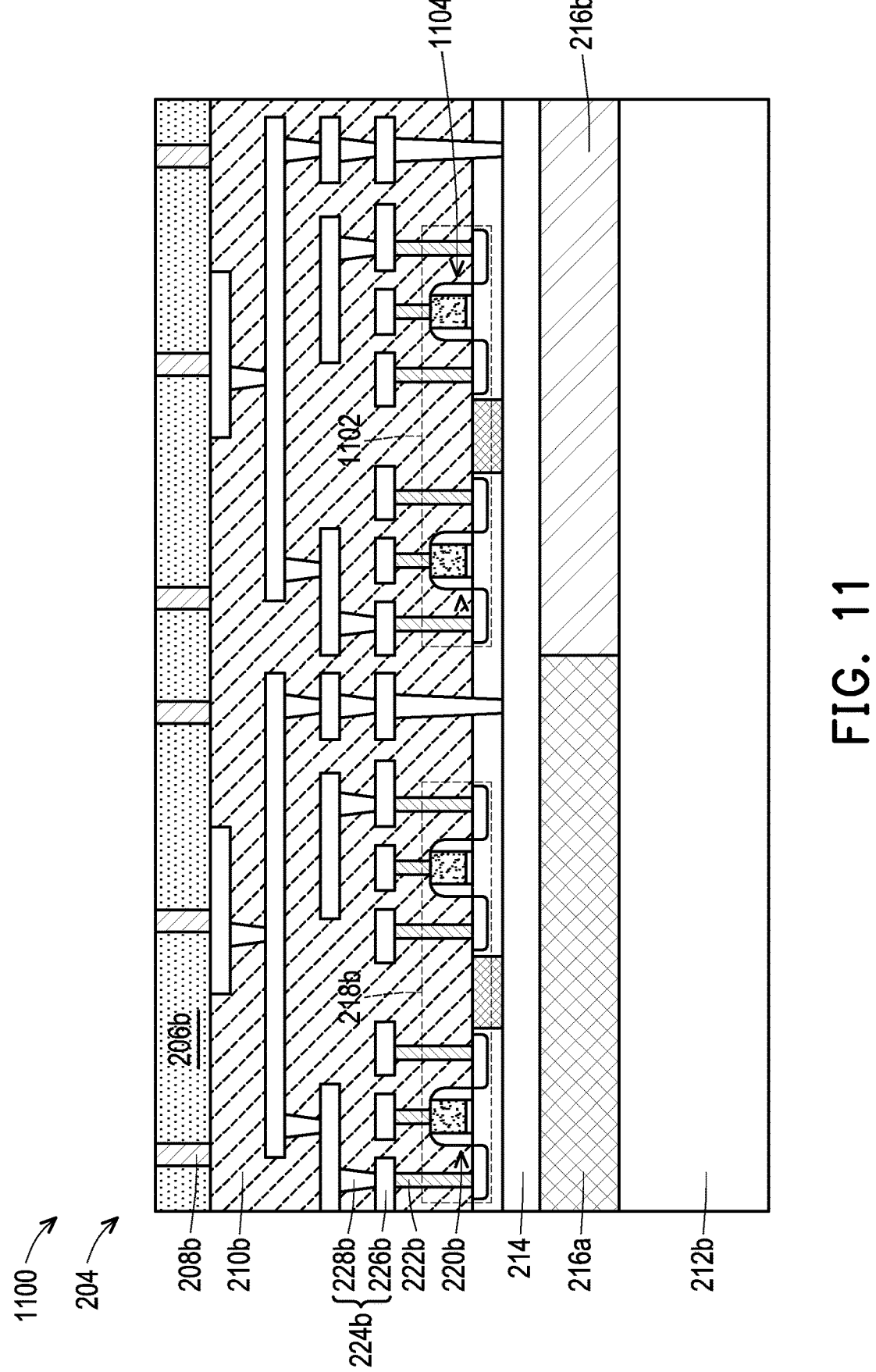
FIG. 11 is a diagram of an example implementation of the RF die described herein.

FIG. 11 is a diagram of an example implementation 1100 of the RF die 204 described herein. The example implementation 1100 includes an example in which the trapping layer 216 includes a plurality of regions, such as a region 216a and a region 216b that have different configurations for grain size, dopants, and/or another parameter. However, other quantities of regions having different configurations are within the scope of the present disclosure.

As shown in FIG. 11, including a trapping layer 216 that has regions 216a, 216b with different configurations enables a plurality of device regions 218b and 1102 to be included in the RF die 204. For example, the device region 218b may be included over the region 216a, and the device region 1102 may be included over the region 216b. This enables the parameters of the region 216a to be selected and/or optimized for the semiconductor devices 220b in the device region 218b, while enabling the parameters of the region 216b to be selected and/or optimized for semiconductor devices 1104 (e.g., RF devices) in the device region 1102, in the same RF die 204. Accordingly, parameters such as grain size, grain size profile, dopant types, dopant concentration, and/or dopant concentration profile, among other examples may be independently selected for the region 216a and the region 216b to satisfy different RF performance parameters in the device regions 218a and 1102, respectively.

As an example, the region 216a may include first one or more types of dopants, and the region 216b may include second one or more types of dopants. The first one or more types of dopants and the second one or more types of dopants may be different types of dopants.

As another example, the region 216a may include a first dopant concentration profile as a function of depth in the region 216a, and the region 216b may include a second dopant concentration profile as a function of depth in the region 216b. The first dopant concentration profile and the second dopant concentration profile may be different dopant concentration profiles.

As another example, the region 216a may include a first grain size profile as a function of depth in the region 216a, and the region 216b may include a second grain size profile as a function of depth in the region 216b. The first grain size profile and the second grain size profile may be different grain size profiles.

As indicated above, FIG. 11 is provided as an example. Other examples may differ from what is described with regard to FIG. 11.

Figure 12A:
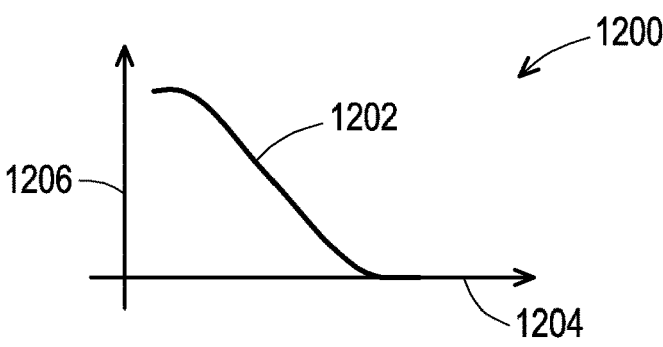
FIGS. 12A-12C are diagrams of example implementations described herein.
Figure 12B:
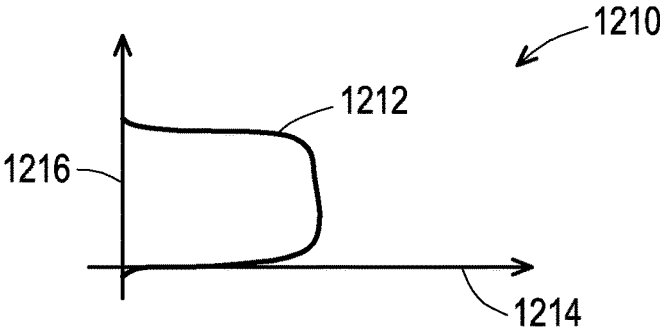
Figure 12C:
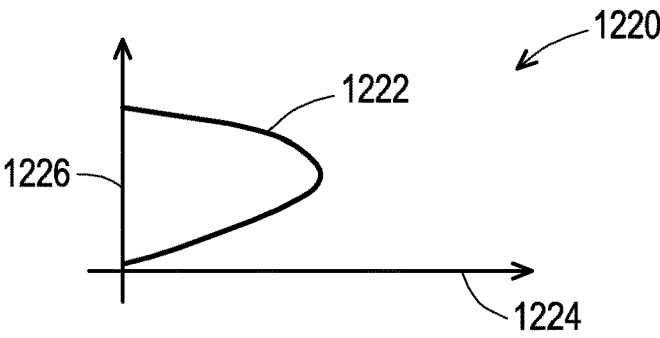

FIGS. 12A-12C are diagrams of example implementations described herein. The example implementations include examples of profiles in a trapping layer 216.

FIG. 12A illustrates an example implementation 1200 of a grain size profile 1202 in a trapping layer 216 described herein. The grain size profile 1202 includes a grain size 1204 that is variable as a function of depth 1206 in the trapping layer 216. The trapping layer 216 may include a depth-varying grain size 1204 between a first surface (e.g., a top surface) of the trapping layer 216 and a second surface (e.g., a bottom surface) of the trapping layer 216 opposing the first surface. As shown in the example implementation 1200 in FIG. 12A, the grain size 1204 may decrease as function of depth 1206 in the trapping layer 216. In other examples, the grain size 1204 may increase as the depth 1206 in the trapping layer 216 increases. In other examples, the grain size profile 1202 includes a combination of an increase in grain size 1204 in a portion of the depth 1206, an approximately constant grain size 1204 in another portion of the depth 1206, and/or a decrease in grain size 1204 in another portion of the depth 1206. Moreover, the grain size profile in a trapping layer 216 described herein may include a grain size that varies in a horizontal direction in the trapping layer 216 instead of, or in addition to, a grain size that is variable as a function of depth in the trapping layer 216

FIGS. 12B and 12C illustrate example implementations 1210 and 1220, respectively, of dopant concentration profiles in a trapping layer 216 described herein. In the example implementation 1210 in FIG. 12B, a dopant concentration profile 1212 includes a dopant concentration 1214 that is variable as a function of depth 1216 in the trapping layer 216. The trapping layer 216 may include a depth-varying dopant concentration 1214 between a first surface (e.g., a top surface) of the trapping layer 216 and a second surface (e.g., a bottom surface) of the trapping layer 216 opposing the first surface. As shown in the example implementation 1210 in FIG. 12B, dopant concentration 1214 may increase as function of depth 1216 in the trapping layer 216 from the top surface of the trapping layer 216 toward a center of the trapping layer 216, and may decrease as a function of depth 1216 from the center of the trapping layer 216 toward the bottom surface of the trapping layer 216. In other examples, the dopant concentration profile 1212 includes an increase in dopant concentration 1214 in a portion of the depth 1216, an approximately constant dopant concentration 1214 in a portion of the depth 1216, and/or a decrease in dopant concentration 1214 in a portion of the depth 1216.

In the example implementation 1220 in FIG. 12C, a dopant concentration profile 1222 includes a dopant concentration 1224 that is variable as a function of depth 1226 in the trapping layer 216. The dopant concentration profile 1222 is similar to the dopant concentration profile 1212. However, the dopant concentration profile 1222 is more rounded relative to the dopant concentration profile 1212. Thus, the dopant concentration 1214 in the example implementation 1210 increases more sharply and decreases more sharply as a function of depth 1216 relative to the dopant concentration profile 1222, whereas the dopant concentration 1224 in the example implementation 1220 increases more gradually and decreases more gradually as a function of depth 1226 relative to the dopant concentration profile 1212.

Moreover, the dopant concentration profile in a trapping layer 216 described herein may include a dopant concentration that varies in a horizontal direction in the trapping layer 216 instead of, or in addition to, a dopant concentration that is variable as a function of depth in the trapping layer 216

As indicated above FIGS. 12A-12C are provided as examples. Other examples may differ from what is described with regard to FIGS. 12A-12C.

Figure 13:
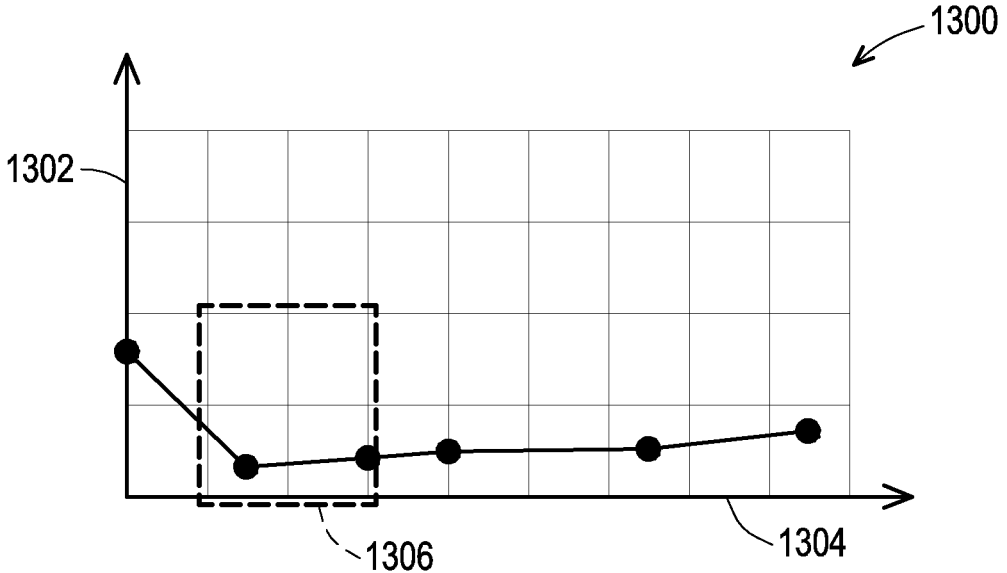
FIG. 13 is a diagram of an example implementation described herein.

FIG. 13 is a diagram of an example implementation 1300 described herein. The example implementation 1300 includes an example illustrating harmonic distortion 1302 in the RF device die 200 as a function of thickness 1304 of the trapping layer 216 in the RF device die 200. As shown in FIG. 13, harmonic distortion 1302 may be minimized in a thickness range 1306 for the thickness 1304 of the trapping layer 216. The thickness 1304 of the trapping layer 216 in the thickness range 1306 may correspond to a relatively small grain size (e.g., less than or approximately equal to 100 nanometers) in the trapping layer 216, as described herein. In some implementations, the thickness range 1306 corresponds to approximately 200 nanometers to approximately 600 nanometers. However, other values for the thickness range 1306 are within the scope of the present disclosure.

As indicated above, FIG. 13 is provided as an example. Other examples may differ from what is described with regard to FIG. 13.

Figure 14:
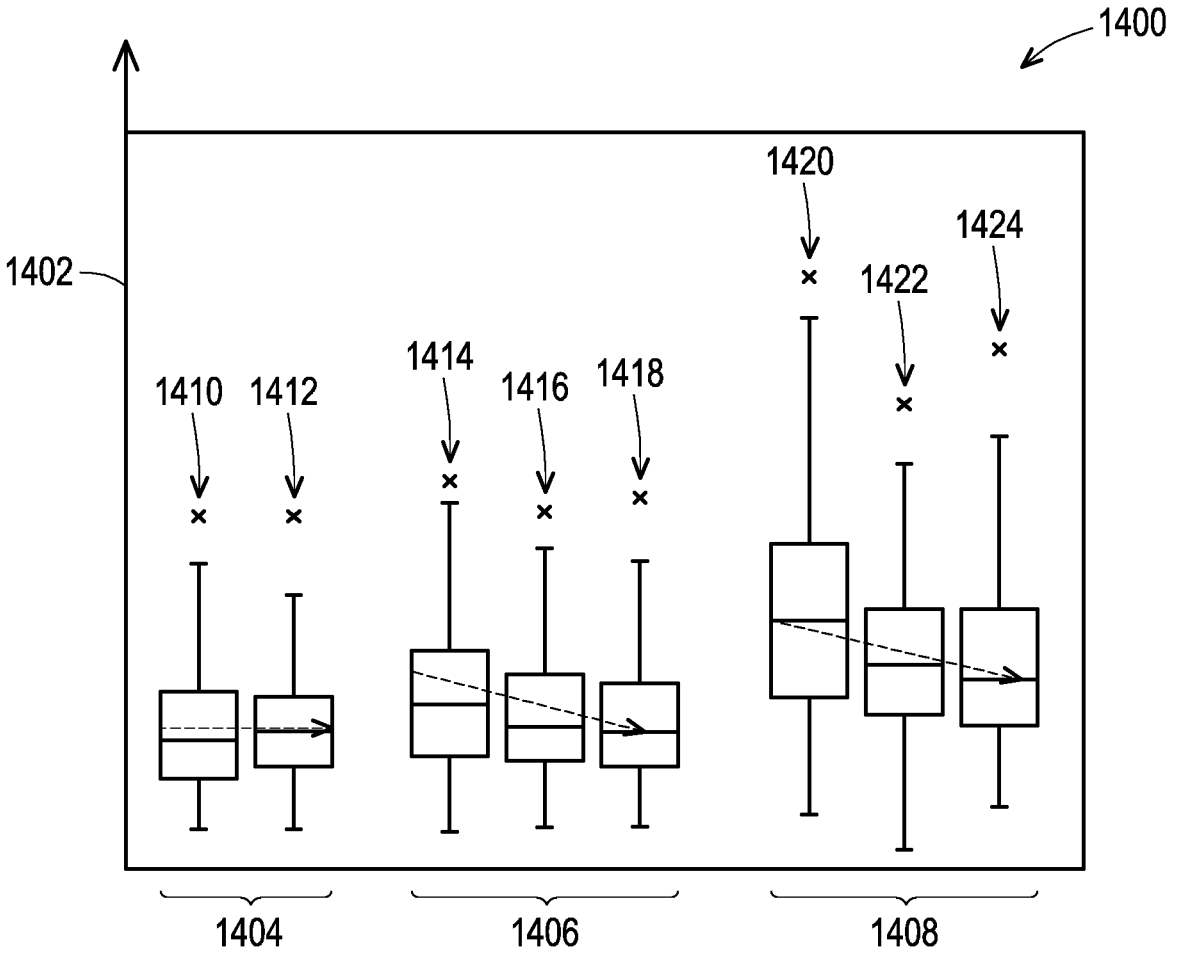
FIG. 14 is a diagram of an example implementation described herein.

FIG. 14 is a diagram of an example implementation 1400 described herein. The example implementation 1400 includes an example illustrating ranges of grain size 1402 in a trapping layer 216 described herein for different dopant concentrations and different annealing temperatures.

As shown in FIG. 14, grain size 1402 may be illustrated for a first group 1404, a second group 1406, and a third group 1408. In the first group 1404, no anneal is performed, and a resulting grain size range 1410 for a trapping layer 216 having no dopants is greater relative to a grain size range 1412 for a trapping layer 216 having a dopant concentration. In the second group 1406, an anneal is performed at a first temperature, and a resulting grain size range 1414 for a trapping layer 216 having no dopants is greater relative to a grain size range 1416 for a trapping layer 216 having a first dopant concentration and a grain size range 1418 for a trapping layer 216 having a second dopant concentration. The second dopant concentration is greater relative to the first dopant concentration, and the grain size range 1418 is lesser relative to the grain size range 1416.

In the third group 1408, an anneal is performed at a second temperature that is greater relative to the first temperature. In the third group 1408, a resulting grain size range 1420 for a trapping layer 216 having no dopants is greater relative to a grain size range 1422 for a trapping layer 216 having a first dopant concentration and a grain size range 1424 for a trapping layer 216 having a second dopant concentration. The second dopant concentration is greater relative to the first dopant concentration, and the grain size range 1424 is lesser relative to the grain size range 1422.

As indicated above, FIG. 14 is provided as an example. Other examples may differ from what is described with regard to FIG. 14.

Figure 15:
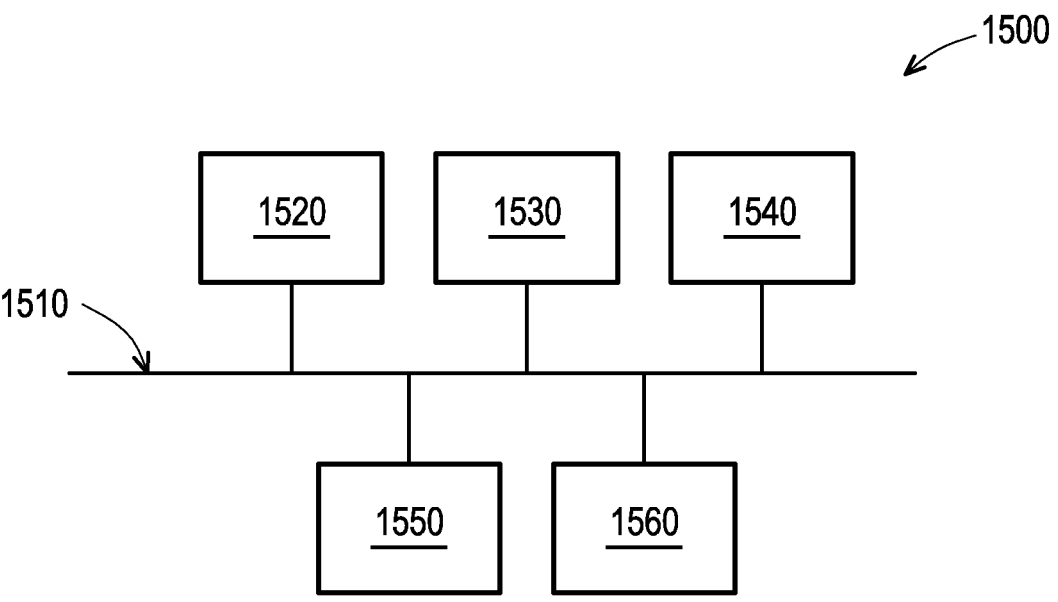
FIG. 15 is a diagram of example components of a device.

FIG. 15 is a diagram of example components of a device 1500. In some implementations, one or more of the semiconductor processing tools 102-116 and/or the wafer/die transport tool 118 may include one or more devices 1500 and/or one or more components of device 1500. As shown in FIG. 15, device 1500 may include a bus 1510, a processor 1520, a memory 1530, an input component 1540, an output component 1550, and a communication component 1560.

Bus 1510 includes one or more components that enable wired and/or wireless communication among the components of device 1500. Bus 1510 may couple together two or more components of FIG. 15, such as via operative coupling, communicative coupling, electronic coupling, and/or electric coupling. Processor 1520 includes a central processing unit, a graphics processing unit, a microprocessor, a controller, a microcontroller, a digital signal processor, a field-programmable gate array, an application-specific integrated circuit, and/or another type of processing component. Processor 1520 is implemented in hardware, firmware, or a combination of hardware and software. In some implementations, processor 1520 includes one or more processors capable of being programmed to perform one or more operations or processes described elsewhere herein.

Memory 1530 includes volatile and/or nonvolatile memory. For example, memory 1530 may include random access memory (RAM), read only memory (ROM), a hard disk drive, and/or another type of memory (e.g., a flash memory, a magnetic memory, and/or an optical memory). Memory 1530 may include internal memory (e.g., RAM, ROM, or a hard disk drive) and/or removable memory (e.g., removable via a universal serial bus connection). Memory 1530 may be a non-transitory computer-readable medium. Memory 1530 stores information, instructions, and/or software (e.g., one or more software applications) related to the operation of device 1500. In some implementations, memory 1530 includes one or more memories that are coupled to one or more processors (e.g., processor 1520), such as via bus 1510.

Input component 1540 enables device 1500 to receive input, such as user input and/or sensed input. For example, input component 1540 may include a touch screen, a keyboard, a keypad, a mouse, a button, a microphone, a switch, a sensor, a global positioning system sensor, an accelerometer, a gyroscope, and/or an actuator. Output component 1550 enables device 1500 to provide output, such as via a display, a speaker, and/or a light-emitting diode. Communication component 1560 enables device 1500 to communicate with other devices via a wired connection and/or a wireless connection. For example, communication component 1560 may include a receiver, a transmitter, a transceiver, a modem, a network interface card, and/or an antenna.

Device 1500 may perform one or more operations or processes described herein. For example, a non-transitory computer-readable medium (e.g., memory 1530) may store a set of instructions (e.g., one or more instructions or code) for execution by processor 1520. Processor 1520 may execute the set of instructions to perform one or more operations or processes described herein. In some implementations, execution of the set of instructions, by one or more processors 1520, causes the one or more processors 1520 and/or the device 1500 to perform one or more operations or processes described herein. In some implementations, hardwired circuitry is used instead of or in combination with the instructions to perform one or more operations or processes described herein. Additionally, or alternatively, processor 1520 may be configured to perform one or more operations or processes described herein. Thus, implementations described herein are not limited to any specific combination of hardware circuitry and software.

The number and arrangement of components shown in FIG. 15 are provided as an example. Device 1500 may include additional components, fewer components, different components, or differently arranged components than those shown in FIG. 15. Additionally, or alternatively, a set of components (e.g., one or more components) of device 1500 may perform one or more functions described as being performed by another set of components of device 1500.

Figure 16:
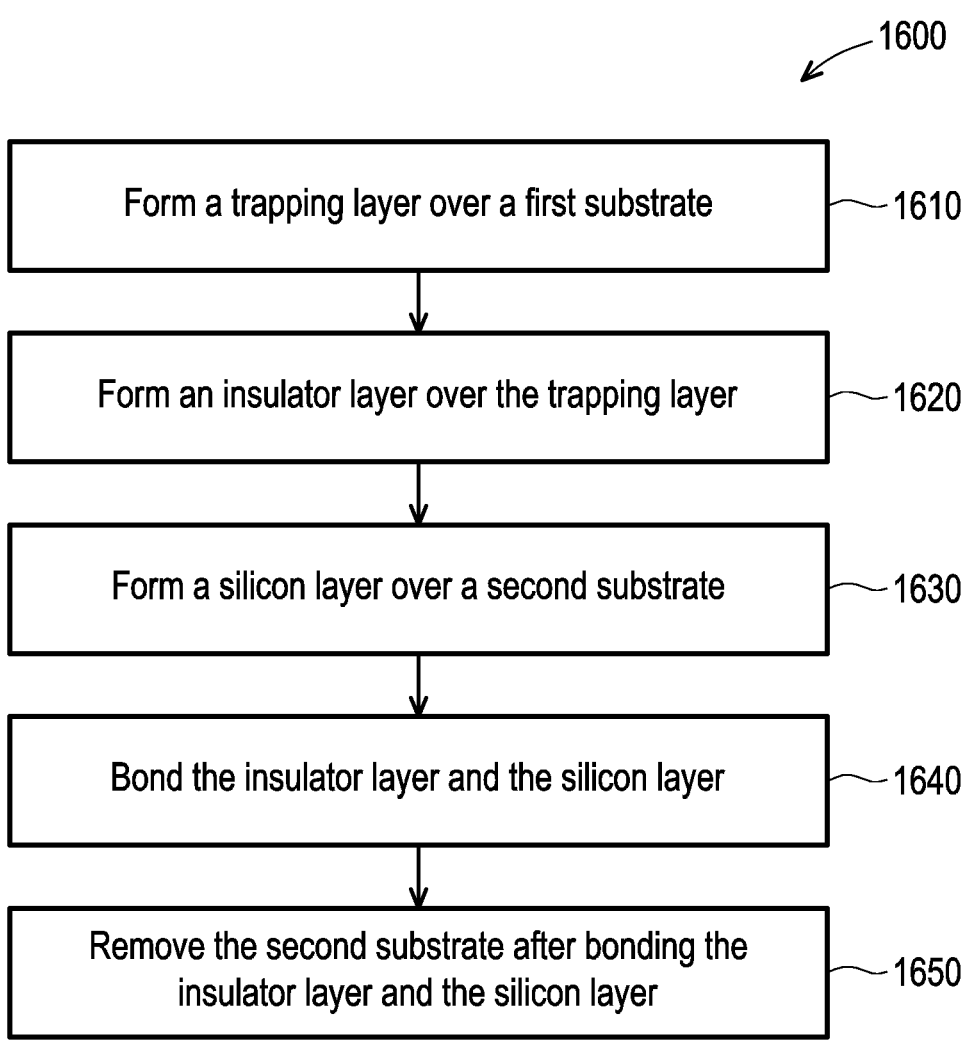
FIG. 16 is a flowchart of an example process associated with forming a semiconductor device.

FIG. 16 is a flowchart of an example process 1600 associated with forming a semiconductor device. In some implementations, one or more process blocks of FIG. 16 are performed by a one or more semiconductor processing tools (e.g., one or more of the semiconductor processing tools 102-116). Additionally, or alternatively, one or more process blocks of FIG. 16 may be performed by one or more components of device 1500, such as processor 1520, memory 1530, input component 1540, output component 1550, and/or communication component 1560.

As shown in FIG. 16, process 1600 may include forming a trapping layer over a first substrate (block 1610). For example, one or more of the semiconductor processing tools 102-116 may form a trapping layer 216 over a first substrate (e.g., the high-resistance 212b), as described above.

As further shown in FIG. 16, process 1600 may include forming an insulator layer over the trapping layer (block 1620). For example, one or more of the semiconductor processing tools 102-116 may form an insulator layer 214 over the trapping layer 216, as described above.

As further shown in FIG. 16, process 1600 may include forming a silicon layer over a second substrate (block 1630). For example, one or more of the semiconductor processing tools 102-116 may form a silicon layer (e.g., the device layer 210b) over a second substrate (e.g., the device substrate 604), as described above.

As further shown in FIG. 16, process 1600 may include bonding the insulator layer and the silicon layer (block 1640). For example, one or more of the semiconductor processing tools 102-116 may bond the insulator layer 214 and the silicon layer, as described above.

As further shown in FIG. 16, process 1600 may include removing the second substrate after bonding the insulator layer and the silicon layer (block 1650). For example, one or more of the semiconductor processing tools 102-116 may remove the second substrate after bonding the insulator layer 214 and the silicon layer, as described above.

Process 1600 may include additional implementations, such as any single implementation or any combination of implementations described below and/or in connection with one or more other processes described elsewhere herein.

In a first implementation, forming the trapping layer 216 includes forming the trapping layer 216 to a thickness that is included in a range of approximately 200 nanometers to approximately 600 nanometers. In a second implementation, alone or in combination with the first implementation, forming the trapping layer 216 includes forming the trapping layer 216 such that a grain size in the trapping layer 216 is included in a range of approximately 20 nanometers to approximately 100 nanometers. In a third implementation, alone or in combination with one or more of the first and second implementations, process 1600 includes forming one or more RF devices (e.g., semiconductor device(s) 220b) in the silicon layer after removing the second substrate.

In a fourth implementation, alone or in combination with one or more of the first through third implementations, process 1600 includes forming an epitaxial layer 606 on the second substrate, and forming an etch stop layer 608 on the epitaxial layer 606, where forming the silicon layer over the second substrate includes forming the silicon layer on the etch stop layer 608. In a fifth implementation, alone or in combination with one or more of the first through fourth implementations, removing the second substrate includes removing the second substrate from the epitaxial layer 606, and process 1600 includes removing the epitaxial layer 606 from the etch stop layer 608 after removing the second substrate, and removing the etch stop layer 608 from the silicon layer after removing the epitaxial layer 606.

In a sixth implementation, alone or in combination with one or more of the first through fifth implementations, process 1600 includes reducing a thickness of the silicon layer after removing the etch stop layer 608 from the silicon layer. In a seventh implementation, alone or in combination with one or more of the first through sixth implementations, process 1600 includes doping the trapping layer 216 with one or more dopants, the one or more dopants including at least one of oxygen (O), carbon (C), nitrogen (N), germanium (Ge), (Se), antimony (Sb), or tellurium (Te).

In an eighth implementation, alone or in combination with one or more of the first through seventh implementations, forming the trapping layer 216 includes etching a top surface of the first substrate, forming a polysilicon seed layer (e.g., a seed layer 404) on the top surface of the first substrate after etching the top surface, and forming the trapping layer 216 on the polysilicon seed layer. In a ninth implementation, alone or in combination with one or more of the first through eighth implementations, forming the trapping layer 216 includes forming the trapping layer 216 at a temperature that is included in a range of approximately 550 degrees Celsius to approximately 700 degrees Celsius.

Although FIG. 16 shows example blocks of process 1600, in some implementations, process 1600 includes additional blocks, fewer blocks, different blocks, or differently arranged blocks than those depicted in FIG. 16. Additionally, or alternatively, two or more of the blocks of process 1600 may be performed in parallel.

Figure 17:
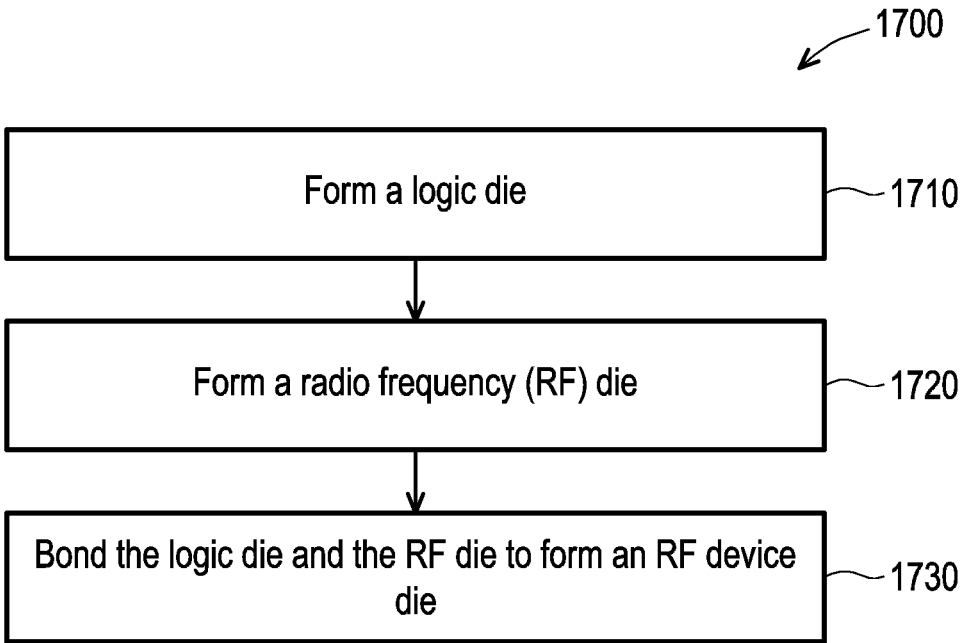
FIG. 17 is a flowchart of an example process associated with forming a semiconductor device.

FIG. 17 is a flowchart of an example process 1700 associated with forming a semiconductor device. In some implementations, one or more process blocks of FIG. 17 are performed by one or more semiconductor processing tools (e.g., one or more of the semiconductor processing tools 102-116). Additionally, or alternatively, one or more process blocks of FIG. 17 may be performed by one or more components of device 1500, such as processor 1520, memory 1530, input component 1540, output component 1550, and/or communication component 1560.

As shown in FIG. 17, process 1700 may include forming a logic die (block 1710). For example, one or more of the semiconductor processing tools 102-116 may form a logic die 202, as described above.

As further shown in FIG. 17, process 1700 may include forming an RF die (block 1720). For example, one or more of the semiconductor processing tools 102-116 may form an RF die 204, as described above.

As further shown in FIG. 17, process 1700 may include bonding the logic die and the RF die to form an RF device die (block 1730). For example, one or more of the semiconductor processing tools 102-116 may bond the logic die 202 and the RF die 204 to form an RF device die 200, as described above. In some implementations, the logic die 202 and the RF die 204 are vertically stacked in the RF device die 200.

Process 1700 may include additional implementations, such as any single implementation or any combination of implementations described below and/or in connection with one or more other processes described elsewhere herein.

In a first implementation, process 1700 includes attaching the RF device die 200 to an interposer 1006 of a multi-die wafer-level package (e.g., a multi-die package 1002). In a second implementation, alone or in combination with the first implementation, process 1700 includes reducing a thickness of a high-resistance substrate 212b of the RF die 204 prior to or after bonding the logic die 202 and the RF die 204.

In a third implementation, alone or in combination with one or more of the first and second implementations, process 1700 includes forming a first RDL structure 206a on the logic die 202, and forming a second RDL structure 206b on the RF die 204, where bonding the logic die 202 and the RF die 204 includes bonding the logic die 202 and the RF die 204 at a bonding interface 902 between the first RDL structure 206a and the second RDL structure 206b.

Although FIG. 17 shows example blocks of process 1700, in some implementations, process 1700 includes additional blocks, fewer blocks, different blocks, or differently arranged blocks than those depicted in FIG. 17. Additionally, or alternatively, two or more of the blocks of process 1700 may be performed in parallel.

In this way, an insulator layer of a trap-rich SOI wafer is formed on a trapping layer over a high-temperature substrate instead of forming the insulator layer on a bulk silicon substrate. The silicon layer of the trap-rich SOI wafer is formed on a second wafer and is bonded to the insulator layer that was grown on the trapping layer. The second wafer is then removed by grinding, polishing, and/or another technique such that no cutting of the silicon device layer is performed, and therefore little to no surface damage is caused to the silicon layer. Accordingly, high-temperature processing, such as a high-temperature annealing operation to remove surface damage that would otherwise be caused by cutting of the silicon layer, may be omitted in the process to form the trap-rich SOI wafer. Thus, operations to form the trap-rich SOI wafer may be performed at a lower thermal budget (e.g., at lower temperatures), which enables the trapping layer of the trap-rich SOI wafer to be formed to a lesser thickness than if high-temperature processing were to be performed for the trap-rich SOI wafer.

As described in greater detail above, some implementations described herein provide a method. The method includes forming a trapping layer over a first substrate. The method includes forming an insulator layer over the trapping layer. The method includes forming a silicon layer over a second substrate. The method includes bonding the insulator layer and the silicon layer. The method includes removing the second substrate after bonding the insulator layer and the silicon layer.

As described in greater detail above, some implementations described herein provide a method. The method includes forming a logic die. The method includes forming an RF die. The method includes bonding the logic die and the RF die to form an RF device die, where the logic die and the RF die are vertically stacked in the RF device die.

As described in greater detail above, some implementations described herein provide an RF device. The RF device includes a logic die. The RF device includes an RF die bonded with the logic die. The RF die includes a high-resistance substrate and a polysilicon trapping layer on the high-resistance substrate. The polysilicon trapping layer is doped with one or more types of dopants. The RF die includes an insulator layer on the polysilicon trapping layer and an RF device layer on the insulator layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   etching a top surface of a first substrate;
   forming a polysilicon seed layer on the top surface of the first substate after etching the top surface of the first substrate;
   forming a trapping layer on the polysilicon seed layer, wherein a grain size of the polysilicon seed layer is less than a grain size of the trapping layer;
   forming, after forming the trapping layer, an insulator layer over the trapping layer;
   forming a silicon layer over a second substrate;
   bonding, after forming the insulating layer and forming the silicon layer, the insulator layer and the silicon layer; and
   removing the second substrate after bonding the insulator layer and the silicon layer.

2. The method of claim 1,
   wherein forming the trapping layer comprises:
      forming the trapping layer to a thickness that is included in a range of approximately 200 nanometers to approximately 600 nanometers.

3. The method of claim 1,
   wherein the grain size of the trapping layer is included in a range of approximately 20 nanometers to approximately 100 nanometers.

4. The method of claim 1, further comprising:
   forming one or more radio frequency (RF) devices in the silicon layer after removing the second substrate.

5. The method of claim 1, further comprising:
   forming an epitaxial layer on the second substrate; and
   forming an etch stop layer on the epitaxial layer,
      wherein forming the silicon layer over the second substrate comprises:
         forming the silicon layer on the etch stop layer.

6. The method of claim 5,
wherein removing the second substrate comprises:
    removing the second substrate from the epitaxial layer; and
    wherein the method further comprises:
        removing the epitaxial layer from the etch stop layer after removing the second substrate; and
        removing the etch stop layer from the silicon layer after removing the epitaxial layer.

7. The method of claim 6, further comprising:
reducing a thickness of the silicon layer after removing the etch stop layer from the silicon layer.

8. The method of claim 1, further comprising:
doping the trapping layer with one or more dopants,
    wherein the one or more dopants comprise at least one of:
        oxygen (O),
        carbon (C),
        nitrogen (N),
        germanium (Ge),
        selenium (Se),
        antimony (Sb), or
        tellurium (Te).

9. The method of claim 1,
wherein forming the trapping layer comprises:
    forming the trapping layer at a temperature that is included in a range of approximately 550 degrees Celsius to approximately 700 degrees Celsius.

10. A method, comprising:
forming a logic die;
forming, after forming the logic die, a radio frequency (RF) die comprising;
    etching a top surface of a high-resistance substrate;
    forming a polysilicon seed layer on the top surface of the high-resistance substrate after etching the top surface of the high-resistance substrate; and
    forming a trapping layer on the polysilicon seed layer, wherein a grain size of the polysilicon seed layer is less than a grain size of the trapping layer;
reducing a thickness of the high-resistance substrate of the RF die; and
bonding, after reducing the thickness of the high-resistance substrate of the RF die, the logic die and the RF die to form an RF device die,
    wherein a high-resistance substrate of the logic die and the high-resistance substrate of the RF die are on opposite sides of the RF device die,
    wherein a thickness of the high-resistance substrate of the logic die is greater than the thickness of high-resistance substrate of the RF die, and
    wherein the logic die and the RF die are vertically stacked in the RF device die.

11. The method of claim 10, further comprising:
attaching the RF device die to an interposer of a multi-die wafer-level package.

12. The method of claim 10, further comprising:
forming a first redistribution layer (RDL) structure on the logic die; and
forming a second RDL structure on the RF die,
    wherein bonding the logic die and the RF die comprises:
        bonding the logic die and the RF die at a bonding interface between the first RDL structure and the second RDL structure.

13. A radio frequency (RF) device die, comprising:
a logic die comprising a high-resistance substrate of the logic die; and an RF die, bonded with the logic die, comprising:
    a high-resistance substrate of the RF die, wherein a thickness of the high-resistance substrate of the logic die is greater than the thickness of the high-resistance substrate of the RF die,
    a polysilicon trapping layer on a top surface of the high-resistance substrate of the RF die, wherein the polysilicon trapping layer is doped with one or more types of dopants and comprises a first region and a second region that is side by side with the first region, wherein the first region includes a first combination of the one or more types of dopants and the second region includes a second combination of the one or more types of dopants, wherein the second combination is different from the first combination,
    an insulator layer on the polysilicon trapping layer, and
    an RF device layer having a first side directly on the insulator layer and a second side, opposite of the first side, bonded to the logic die, wherein a high-resistance substrate of the logic die and the high-resistance substrate of the RF die are on opposite sides of the RF device die.

14. The RF device die of claim 13,
wherein the polysilicon trapping layer includes a depth-varying grain size between a first surface of the polysilicon trapping layer and a second surface of the polysilicon trapping layer opposing the first surface.

15. The RF device die of claim 13,
wherein the polysilicon trapping layer includes a depth-varying dopant concentration between a first surface of the polysilicon trapping layer and a second surface of the polysilicon trapping layer opposing the first surface.

16. The RF device die of claim 13,
wherein:
    the first region includes a first dopant concentration profile as a function of depth in the first region of the polysilicon trapping layer; and
    the second region includes a second dopant concentration profile as
a function of depth in the second region of the polysilicon trapping layer,
    wherein the first dopant concentration profile and the second dopant concentration profile are different dopant concentration profiles.

17. The RF device die of claim 13,
wherein:
    the first region includes a first grain size profile as a function of depth in the first region of the polysilicon trapping layer; and
    the second region includes a second grain size profile as a function of depth in the second region of the polysilicon trapping layer,
        wherein the first grain size profile and the second grain size profile are different grain size profiles.

18. The RF device die of claim 13,
wherein the polysilicon trapping layer is formed to a thickness included in a range of approximately 200 nanometers to approximately 600 nanometers.

19. The RF device die of claim 13, further comprising:
a polysilicon seed layer between the high-resistance substrate of the RF die and the polysilicon trapping layer.

20. The RF device die of claim 13,
wherein the insulator layer is formed to a thickness
included in a range of approximately 50 nanometers to
approximately 400 nanometers.

* * * * *